US009520171B2

(12) United States Patent
Inokuchi et al.

(10) Patent No.: US 9,520,171 B2
(45) Date of Patent: Dec. 13, 2016

(54) RESISTIVE CHANGE MEMORY

(71) Applicant: KABUSHIKI KAISHA TOSHIBA, Minato-ku (JP)

(72) Inventors: Tomoaki Inokuchi, Yokohama (JP); Mizue Ishikawa, Yokohama (JP); Hideyuki Sugiyama, Kawasaki (JP); Yoshiaki Saito, Kawasaki (JP); Tetsufumi Tanamoto, Kawasaki (JP)

(73) Assignee: KABUSHIKI KAISHA TOSHIBA, Minato-ku (JP)

( * ) Notice: Subject to any disclaimer, the term of this patent is extended or adjusted under 35 U.S.C. 154(b) by 0 days.

(21) Appl. No.: 14/832,520

(22) Filed: Aug. 21, 2015

(65) Prior Publication Data
US 2015/0357016 A1  Dec. 10, 2015

Related U.S. Application Data

(63) Continuation of application No. PCT/JP2014/068013, filed on Jul. 7, 2014.

(30) Foreign Application Priority Data

Sep. 20, 2013  (JP) .................................. 2013-195705

(51) Int. Cl.
  *G11C 11/15* (2006.01)
  *G11C 11/16* (2006.01)
  (Continued)

(52) U.S. Cl.
  CPC ............. *G11C 11/161* (2013.01); *G11C 11/15* (2013.01); *G11C 11/1659* (2013.01);
  (Continued)

(58) Field of Classification Search
  CPC .................................................. G11C 13/003
  (Continued)

(56) References Cited

U.S. PATENT DOCUMENTS 7,570,510 B2 * 8/2009 Johnson ................. G01R 33/06
                                                                365/158
8,139,403 B2   3/2012 Inokuchi et al.
(Continued)

FOREIGN PATENT DOCUMENTS

JP         2-229466       9/1990
JP      2007-243180      9/2007
(Continued)

OTHER PUBLICATIONS

International Search Report issued Aug. 19, 2014 in PCT/JP2014/068013 filed Jul. 7, 2014.
(Continued)

*Primary Examiner* — Hoai V Ho
*Assistant Examiner* — Jay Radke
(74) *Attorney, Agent, or Firm* — Oblon, McClelland, Maier & Neustadt, L.L.P.

(57) ABSTRACT

A resistive change memory according to an embodiment includes: a memory cell including a resistive change element comprising a first and second terminals, and a semiconductor element, the semiconductor element including a first semiconductor layer of a first conductivity type, a second semiconductor layer of the first conductivity type, and a third semiconductor layer of a second conductivity type that is different from the first conductivity type, the third semiconductor layer being disposed between the first semiconductor layer and the second semiconductor layer, the first semiconductor layer being connected to the second terminal of the resistive change element; and a read unit configured to perform a read operation by applying a first read voltage between the first terminal and the second semiconductor layer, and then applying a second read voltage that is lower than the first read voltage between the first terminal and the second semiconductor layer.

12 Claims, 18 Drawing Sheets

(51) Int. Cl.
*H01L 43/08* (2006.01)
*H01L 27/22* (2006.01)

(52) U.S. Cl.
CPC ...... *G11C 11/1673* (2013.01); *G11C 11/1675* (2013.01); *G11C 11/1693* (2013.01); *H01L 27/224* (2013.01); *H01L 27/228* (2013.01); *H01L 43/08* (2013.01); *G11C 2213/72* (2013.01); *G11C 2213/74* (2013.01); *G11C 2213/79* (2013.01)

(58) Field of Classification Search
USPC .................................. 365/148, 158
See application file for complete search history.

(56) References Cited

U.S. PATENT DOCUMENTS

| | | | |
|---|---|---|---|
| 8,159,871 B2 | 4/2012 | Chung | |
| 2004/0062117 A1* | 4/2004 | Perner | G11C 7/062 365/209 |
| 2004/0246761 A1* | 12/2004 | Nishihara | G11C 11/22 365/145 |
| 2005/0180188 A1* | 8/2005 | Bedeschi | G11C 7/12 365/145 |
| 2007/0210296 A1 | 9/2007 | Cote et al. | |
| 2008/0049489 A1* | 2/2008 | Johnson | G01R 33/06 365/158 |
| 2008/0085567 A1 | 4/2008 | Tanaka et al. | |
| 2009/0180312 A1 | 7/2009 | Miura et al. | |
| 2012/0061639 A1 | 3/2012 | Yasuda | |
| 2012/0099363 A1 | 4/2012 | Inaba | |
| 2013/0042081 A1 | 2/2013 | Park et al. | |
| 2015/0348623 A1* | 12/2015 | Lin | G11C 13/0069 365/148 |

FOREIGN PATENT DOCUMENTS

| | | |
|---|---|---|
| JP | 2009-152258 | 7/2009 |
| JP | 2010-153766 | 7/2010 |
| JP | 2011-199064 | 10/2011 |
| JP | 2012-64669 | 3/2012 |
| JP | 2012-89741 | 5/2012 |
| JP | 2013-38421 | 2/2013 |
| JP | 2013-175680 | 9/2013 |
| WO | WO 03/081680 | 10/2003 |

OTHER PUBLICATIONS

S. Ikeda, et al., "Tunnel magnetoresistance of 604% at 300 K by suppression of Ta diffusion in Co Fe B/Mg O/Co Fe B pseudo-spin-valves annealed at high temperature", Applied Physics Letters 93, Aug. 25, 2008 (2008), 4 Pages.

Jin-Woo Han, et al., "Bistable Resistor (Biristor)—Gateless Silicon Nanowire Memory", 2010 Symposium on VLSI Technology Digest of Technical Papers, p. 171-172.

* cited by examiner

RESISTIVE CHANGE MEMORY

CROSS REFERENCE TO RELATED APPLICATIONS

This application is a continuation of International Application No. PCT/JP2014/068013, filed on Jul. 7, 2014, which is based upon and claims the benefit of priority from the prior Japanese Patent Application No. 2013-195705, filed on Sep. 20, 2013, the entire contents of which are incorporated herein by reference.

FIELD

Embodiments described herein relate generally to resistive change memories.

BACKGROUND

In recent years, vigorous attempts have been made to apply magnetoresistive elements using the tunnel magnetoresistance effect to magnetic random access memories (MRAMs). The MRAMs including magnetoresistive elements have advantages such as nonvolatile data storage, write time and read time of 10 ns or shorter, and $10^{15}$ or more times of data rewriting.

The magnetoresistance change rate (MR ratio) of a magnetoresistive element, however, is about 600% at maximum at room temperature. Accordingly, the ratio of a high resistance value to a low resistance value in an MRAM is less than that in nonvolatile memories of other kinds. Due to this, an MRAM with magnetoresistive elements requires highly accurate sense amplifiers. This may cause a problem of an increase in periphery circuit area. There is also a problem in that disposing such sense amplifiers to several locations in a memory circuit would be difficult.

DETAILED DESCRIPTION

A resistive change memory according to an embodiment includes: a memory cell including a resistive change element and a semiconductor element, the resistive change element comprising a first terminal and a second terminal, the semiconductor element comprising a first semiconductor layer of a first conductivity type, a second semiconductor layer of the first conductivity type, and a third semiconductor layer of a second conductivity type that is different from the first conductivity type, the third semiconductor layer being disposed between the first semiconductor layer and the second semiconductor layer, the first semiconductor layer being connected to the second terminal of the resistive change element; and a read unit configured to perform a read operation by applying a first read voltage between the first terminal of the resistive change element and the second semiconductor layer of the semiconductor element, and then applying a second read voltage that is lower than the first read voltage between the first terminal of the resistive change element and the second semiconductor layer of the semiconductor element.

Embodiments will now be explained with reference to the accompanying drawings.

First Embodiment

Figure 1A:
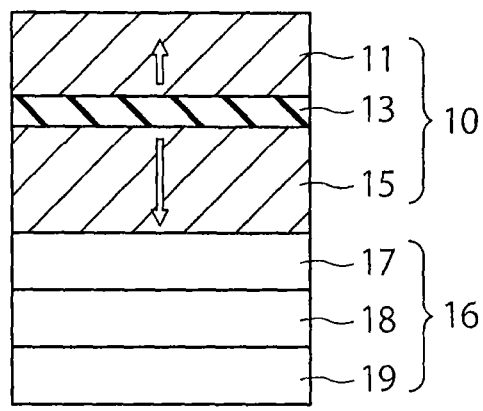
FIGS. 1A and 1B are cross-sectional views of a memory cell of a resistive change memory according to a first embodiment.
Figure 1B:
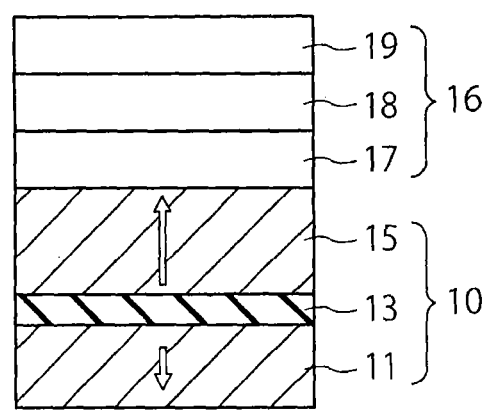

A resistive change memory according to a first embodiment is a spin transfer torque magnetic memory including at least one memory cell. FIGS. 1A and 1B are cross-sectional views showing the memory cell 1. The memory cell 1 is formed on a semiconductor substrate (not shown), and includes a multilayer structure with a ferromagnetic layer 11, a nonmagnetic layer 13, a ferromagnetic layer 15, an N-type semiconductor layer 17, a P-type semiconductor layer 18, and an N-type semiconductor layer 19 disposed in this order or a reversed order. More specifically, the memory cell 1 according to the first embodiment has a structure in which an N-P-N junction element (two-terminal element) 16 including the N-type semiconductor layer 17, the P-type semiconductor layer 18, and the N-type semiconductor layer 19 is connected in series with a magnetoresistive element 10 including the ferromagnetic layer 11, the nonmagnetic layer 13, and the ferromagnetic layer 15. Although FIGS. 1A and 1B show that the magnetoresistive element 10 and the N-P-N junction element 16 are directly connected with each other, a metal layer may be disposed between the magnetoresistive element 10 and the N-P-N junction element 16 in order to reduce the contact resistance, as in a second embodiment described later.

The magnetization direction of one of the ferromagnetic layer 11 and the ferromagnetic layer 15 in the magnetoresistive element 10 is switchable, and the magnetization direction of the other is fixed. The meaning of the magnetization direction being "switchable" is that, if a write current is caused to flow in a direction along the staking direction of the respective layers of the magnetoresistive element 10, the magnetization direction can be changed before and after the write current flows. The meaning of the magnetization direction being "fixed" is that, if a write current is caused to flow in a direction along the staking direction of the respective layers of the magnetoresistive element 10, the magnetization direction is not changed before and after the write current flows. In the first embodiment, the magnetization direction of each of the ferromagnetic layer 11 and the ferromagnetic layer 15 is substantially perpendicular to the film plane of each layer. The "film plane" here means that a plane extending in a direction perpendicular to the stacking direction of the ferromagnetic layers, and means, for example, the top surface or the bottom surface. The magnetization direction of each of the ferromagnetic layer 11 and the ferromagnetic layer 15 may be substantially parallel to the film plane.

(Write Method)

A write method of the memory cell according to the first embodiment will be described below. The writing is performed by causing a write current through the magnetoresistive element 10 in a direction along the stacking direction. An example will be described where the magnetization direction of the ferromagnetic layer 11 is switchable, and the magnetization direction of the ferromagnetic layer 15 is fixed.

First, a write method will be described for switching the magnetization direction of the ferromagnetic layer 11 to be parallel to (in the same direction as) the magnetization direction of the ferromagnetic layer 15 when the initial magnetization direction of the ferromagnetic layer 11 is antiparallel to (in the opposite direction to) the magnetization direction of the ferromagnetic layer 15. In this case, the write current is caused to flow from the ferromagnetic layer 11 to the ferromagnetic layer 15. This means that electrons flow from the ferromagnetic layer 15 to the ferromagnetic layer 11. Electrons passing through the ferromagnetic layer 15 are spin-polarized. The spin-polarized electrons flow to the ferromagnetic layer 11 through the nonmagnetic layer 13 to exert a spin torque on the magnetization of the ferromagnetic layer 11, causing the magnetization direction of the ferromagnetic layer 11 to be parallel to the magnetization direction of the ferromagnetic layer 15.

Next, a write method will be described for switching the magnetization direction of the ferromagnetic layer 11 to be antiparallel to the magnetization direction of the ferromagnetic layer 15 when the initial magnetization direction of the ferromagnetic layer 11 is parallel to the magnetization direction of the ferromagnetic layer 15. In this case, the write current is caused to flow from the ferromagnetic layer 15 to the ferromagnetic layer 11. This means that electrons flow from the ferromagnetic layer 11 to the ferromagnetic layer 15. Electrons passing through the ferromagnetic layer 11 are spin-polarized. The spin-polarized electrons flow to the ferromagnetic layer 15 through the nonmagnetic layer 13. The electrons that are spin-polarized in the same direction as the magnetization direction of the ferromagnetic layer 15 pass through the ferromagnetic layer 15, but the electrons spin-polarized in a direction opposite to the magnetization direction of the ferromagnetic layer 15 are reflected at the interface between the nonmagnetic layer 13 and the ferromagnetic layer 15, flow back to the ferromagnetic layer 11 through the nonmagnetic layer 13, and exert a spin torque on the magnetization of the ferromagnetic layer 11 to be antiparallel to the magnetization direction of the ferromagnetic layer 15.

The writing is performed in the above-described manner. The direction in which the current flows is reversed if the magnetization direction of the ferromagnetic layer 11 is fixed and the magnetization direction of the ferromagnetic layer 15 is switchable.

(Read Method)

The reading principles for the memory cell 1 will be described below.

Figure 2A:
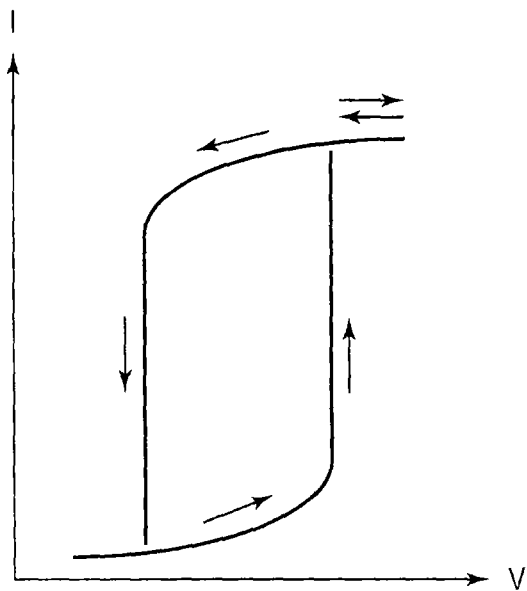
FIG. 2A is a diagram showing the I-V characteristic curves of an N-P-N junction element in a memory cell according to the first embodiment.

Attention is given to the N-P-N junction element 16 including the N-type semiconductor layer 17, the P-type semiconductor layer 18, and the N-type semiconductor layer 19. Controlling the carrier concentration and the width of the N-type semiconductor layers 17, 19 and the P-type semiconductor layer 18 will provide the current-voltage characteristic curves (I-V characteristic curves)) with a hysteresis loop shown in FIG. 2A, as described in the document "Jin-Woo Han and Yang-Kyu Choi, p. 171 2010 Symposium on VLSI Technology Digest of Technical Papers".

Figure 2B:
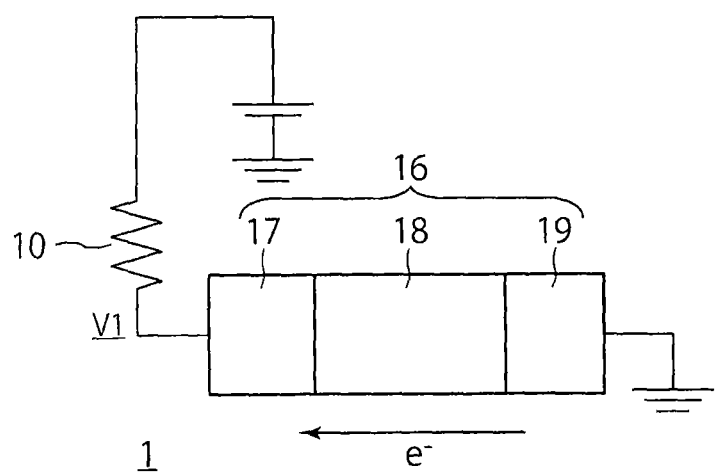
FIG. 2B is an explanatory circuit diagram illustrating the principles for reading a memory cell according to the first embodiment.
Figure 3:
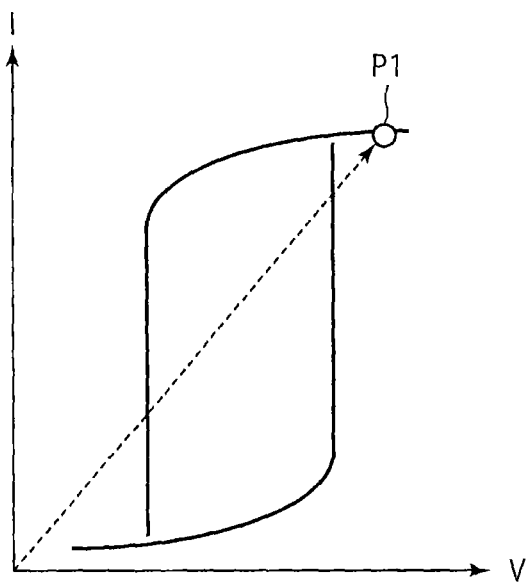
FIG. 3 is an explanatory diagram illustrating the principles for reading the memory cell.

Next, the characteristics of the memory cell 1 in which the magnetoresistive element 10 including the ferromagnetic layer 11, the nonmagnetic layer 13, and the ferromagnetic layer 15 is connected in series with the N-P-N junction element 16 as shown in FIG. 2B will be studied. If a high voltage is applied to the memory cell 1, the N-P-N junction element 16 is turned ON to allow a large current to flow. This state is represented by the point P1 in the I-V characteristic curves shown in FIG. 3. The I-V characteristic curves in FIG. 3 indicate the characteristics of the N-P-N junction element 16.

The voltage applied to the memory cell 1 is then reduced to V'. This changes the operating state depending on the magnitude of the resistance of the magnetoresistive element 10.

Figure 4:
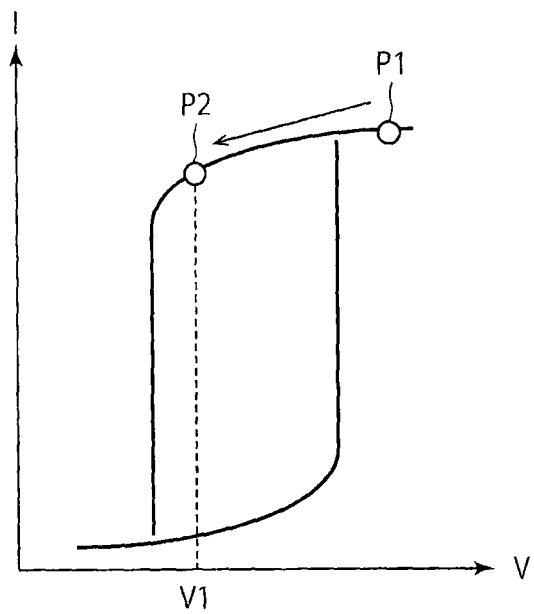
FIG. 4 is an explanatory diagram illustrating the principles for reading the memory cell.
Figure 5:
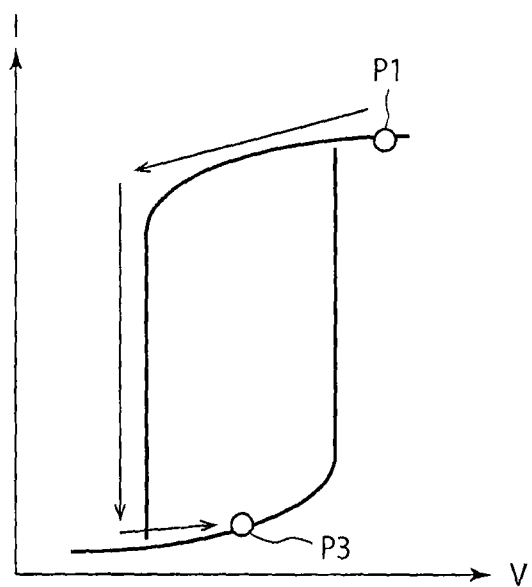
FIG. 5 is an explanatory diagram illustrating the principles for reading the memory cell.

If the resistance of the magnetoresistive element 10 is low, the voltage V1 across the N-P-N junction element 16 is high, and the state changes to the point P2 of the I-V characteristic curves shown in FIG. 4. In contrast, if the resistance of the magnetoresistive element 10 is high, the voltage V1 across the N-P-N junction element 16 is low, and the N-P-N junction element 16 is turned OFF temporarily. This makes the resistance of the N-P-N junction element 16 higher than that of the magnetoresistive element 10, thereby increasing the voltage V1 applied to the N-P-N junction element 16. However, the N-P-N junction element 16 may be kept being in the OFF state by setting the voltage V' to be added to the memory cell 1 to prevent the N-P-N junction element 16 from being tuned ON again. The state of the N-P-N junction element 16 at this time is represented by the point P3 shown in FIG. 5.

As described above, the N-P-N junction element 16 connected in series to the magnetoresistive element 10 in to the memory cell 1 can be switched between the ON state and the OFF state by first applying a high voltage to the memory cell 1, and then reducing the voltage. For example, if the magnetoresistive element 10 with an MR ratio of 300% is connected in series to the N-P-N junction element 16 in the memory cell 1, the ratio of the high resistance value to the low resistance value of the memory cell 1 is about $10^6$. This is remarkably higher than the MR ratio obtained with the magnetoresistive element 10 alone.

Figure 6:
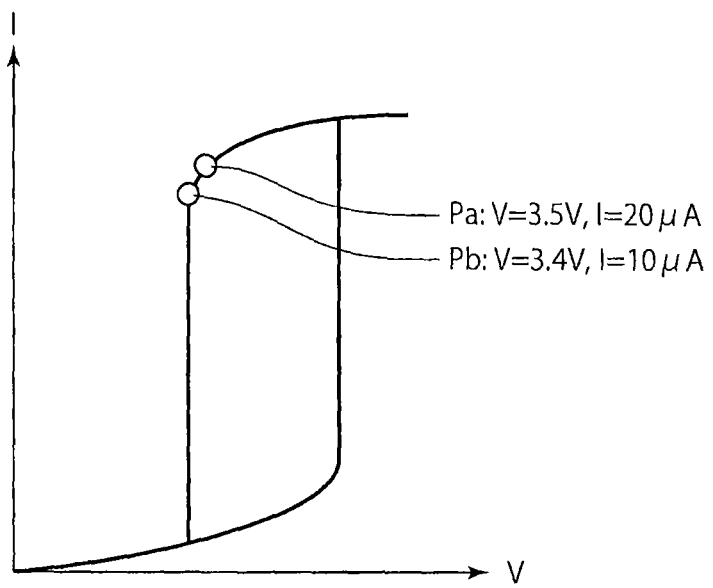
FIG. 6 is a diagram illustrating an example of how a memory cell is read.
Figure 7:
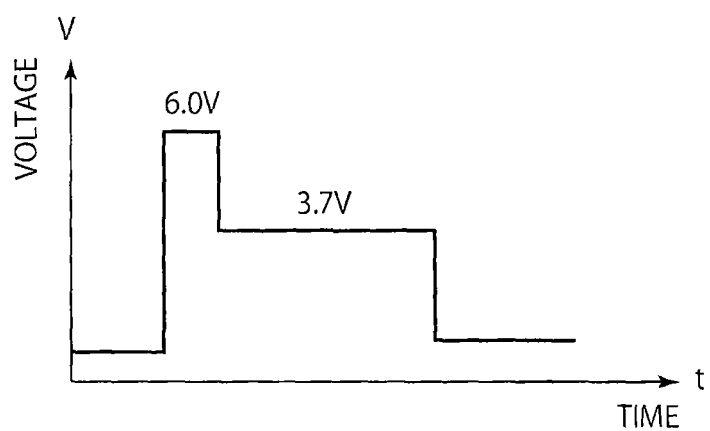
FIG. 7 is a diagram showing a pulse waveform used to read a memory cell.

It is assumed that the memory cell 1 includes an N-P-N junction element 16 with the characteristics shown in FIG. 6 connected in series to the magnetoresistive element 10, and that a pulsed voltage with two stages as shown in FIG. 7 is applied to the memory cell 1. The characteristics shown in FIG. 6 corresponds to those in FIG. 2 of the above-described document "Jin-Woo Han and Yang-Kyu Choi, p. 171 2010 Symposium on VLSI Technology Digest of Technical Papers." At the point Pa in FIG. 6, the voltage applied to the N-P-N junction element 16 is 3.5 V, and the current flowing therethrough is 20 µA. Assuming that the resistance of the magnetoresistive element 10 in which the magnetization of the ferromagnetic layers in the parallel state is 10 kΩ, the voltage applied to the magnetoresistive element 10 is 0.2 V, and the current flowing therethrough is 20 µA. In contrast, assuming that the magnetization of the ferromagnetic layers in the magnetoresistive element 10 is in an antiparallel state and the resistance of the magnetoresistive element 10 is 30 kΩ, the voltage applied to the N-P-N junction element 16 is 3.4 V and the current flowing therethrough is 10 µA, and the voltage applied to the magnetoresistive element 10 is 0.3 V and the current flowing therethrough is 10 µA. This is indicated by the point Pb in FIG. 6. It can be understood from the above that if the resistance of the magnetoresistive element 10 is 30 kΩ or more, the voltage across the N-P-N junction element 16 decreases further to make the N-P-N junction element 16 be in the OFF state.

It is therefore understood that in order to operate the memory cell 1, the MR ratio of the magnetoresistive element 10 may be (30 kΩ-10 kΩ)/10 kΩ×100=200% or more.

It should be noted that the characteristics of the N-P-N junction element 16 and the magnetoresistive element 10 have been described above as an example, and the memory cell 1 may be operated with similar other principles.

Figure 8:
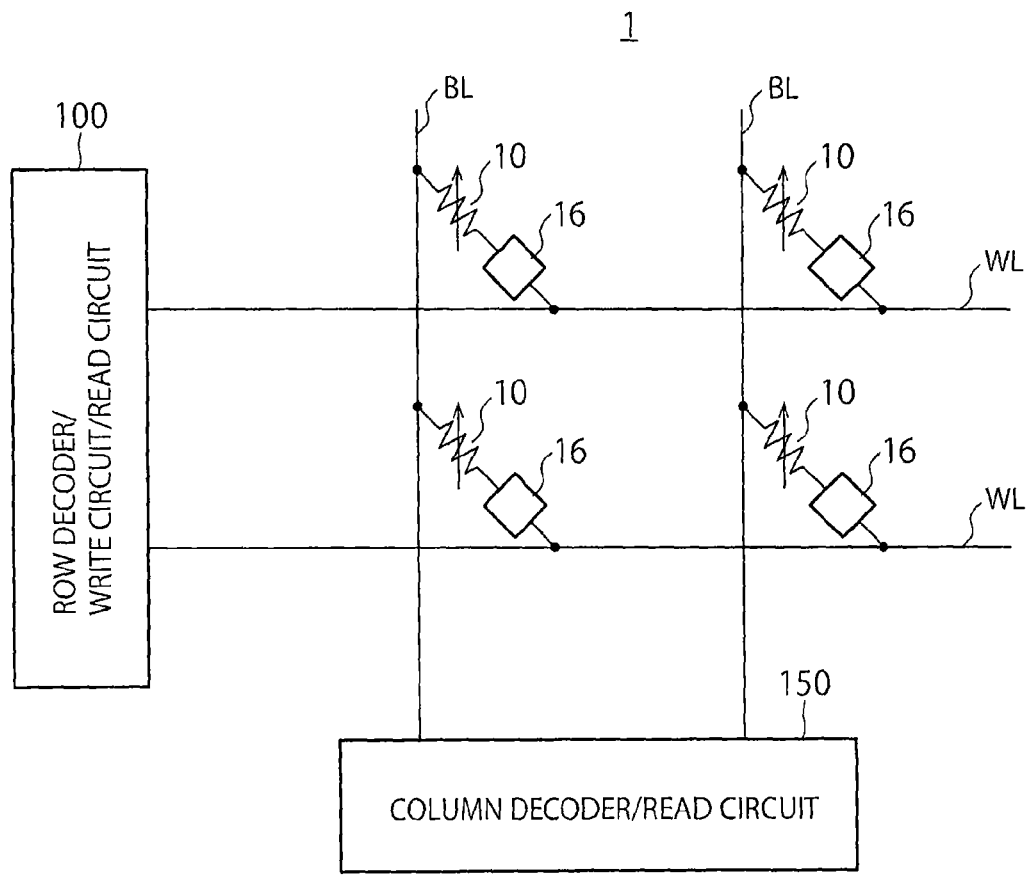
FIG. 8 is a diagram showing a specific example of the circuit configuration of the resistive change memory according to the first embodiment.

FIG. 8 shows a specific example of a circuit configuration of the resistive change memory according to the first embodiment for performing the above-described write method and read method. The resistive change memory of the specific example includes a plurality of memory cells 1 arranged in a matrix form with rows and columns, a plurality of word lines WL, a plurality of bit lines BL crossing the word lines WL, a row decoder/write circuit/read circuit 100, and a column decoder/read circuit 150. Each memory cell 1 is disposed near an intersection region of one of the word lines WL and one of the bit lines BL. The ferromagnetic layer 11 of the magnetoresistive element 10 in each memory cell 1 is connected to the corresponding bit line BL, and the N-type semiconductor layer 19 of the N-P-N junction element 16 is connected to the corresponding word line WL. The two-stage pulsed voltage described with reference to the read method is generated from the row decoder/write circuit/read circuit 100 or the column decoder/read circuit 150.

Although a magnetoresistive element is used as the resistive change element in the first embodiment, a resistive change element other than the magnetoresistive element may be connected in series to the N-P-N junction element. The read method in this case is the same as that for the spin transfer torque magnetic memory according to the first embodiment. The write method, however, is the same as that for the resistive change element used in the memory cell 1.

Figure 17:
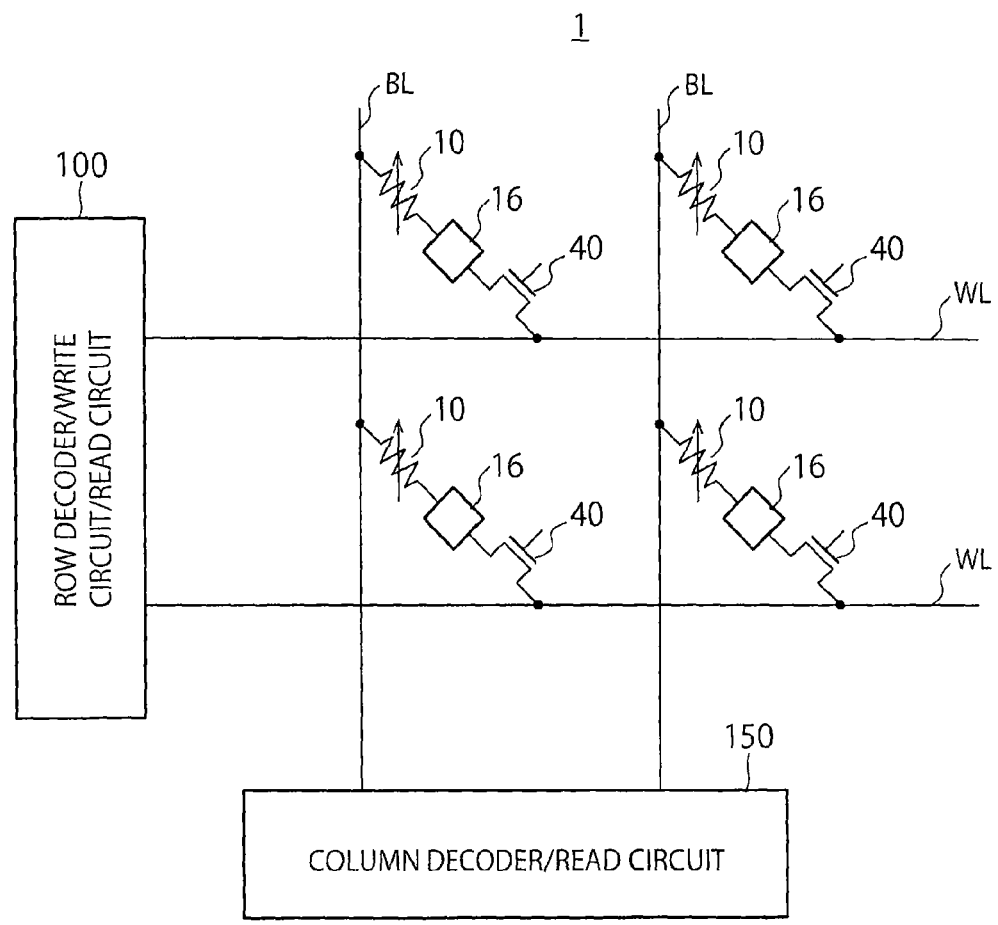
FIG. 17 is a diagram showing a circuit configuration of a resistive change memory according to a modification of the first embodiment.

The memory cell 1 may include a magnetoresistive element 10, an N-P-N junction element 16, and a selection transistor 40 connected in series as in a modification of the first embodiment shown in FIG. 17. The selection transistor 40 receives a signal for selecting the memory cell at its gate. The selection transistor 40 connected to the N-P-N junction element 16 in FIG. 17 may be connected to the magnetoresistive element 10.

Although an N-P-N junction element is used in the first embodiment and its modification, a P-N-P junction element can be used instead of the N-P-N junction element. For example, in FIGS. 1A and 1B, a P-N-P junction element 16 in which the semiconductor layer 17 is a P-type semiconductor layer, the semiconductor layer 18 is an N-type semiconductor layer, and the semiconductor layer 19 is a p-type semiconductor layer may be employed.

In the aforementioned document (Jin-Woo Han and Yang-Kyu Choi, p. 171 2010 Symposium on VLSI Technology Digest of Technical Papers), the N-P-N junction element is expected to be used alone as a volatile storage element. In this volatile storage element, the time required for the transition from an ON state to an OFF state is on the msec order.

In contrast, the N-P-N junction element in the first embodiment does not necessarily store data alone. The N-P-N junction element is used for the purpose of utilizing the I-V characteristics with a hysteresis loop. Therefore, it is preferable that the transition time from an ON state to an OFF state in an N-P-N junction element be as short as possible. In order to shorten the transition time, the recombination center of holes and electrons may be formed in at least one of the N-type semiconductor layer and the P-type semiconductor layer or the interface therebetween, or the leakage current may be intentionally increased at the interface of the N-P junction.

Figure 9:
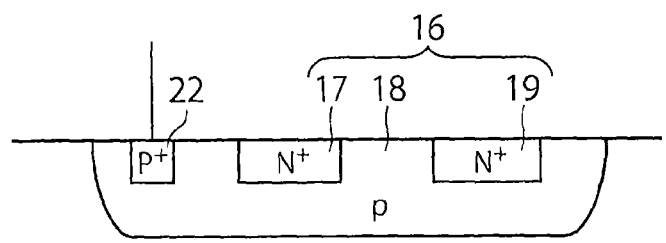
FIG. 9 is an explanatory diagram illustrating an example of a method of removing holes.

If holes should be eliminated, the holes are extracted from the contact with, for example, a well region. A separate terminal may be disposed to extract holes. Specifically, a terminal 22 that is electrically connected to the P-type semiconductor layer 18 of the N-P-N junction element 16 may be disposed as shown FIG. 9. This terminal 22 allows holes accumulated in the P-type semiconductor layer 18 to be forcibly extracted, thereby shorten the transition time from the ON state to the OFF state of the N-P-N junction element 16.

Figure 10:
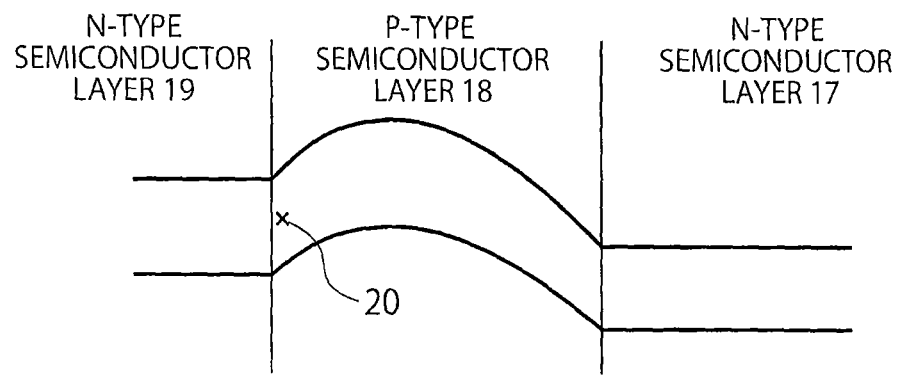
FIG. 10 is an explanatory diagram illustrating another example of the method of removing holes.

Specific examples of a method of locating the recombination center at the interface of the P-N junction includes implantation of an impurity like Au, Mn, Zn, Co, V, Sr, Ge, Cu, Fe, and C to the interface of the P-N junction, and irradiation of the interface with high-energy particles. For example, a recombination center 20 is located at the interface between the P-type semiconductor layer 18 and the N-type semiconductor layer 19 as shown in FIG. 10 in the memory cell 1 connected as shown in FIG. 2B.

Figure 11:
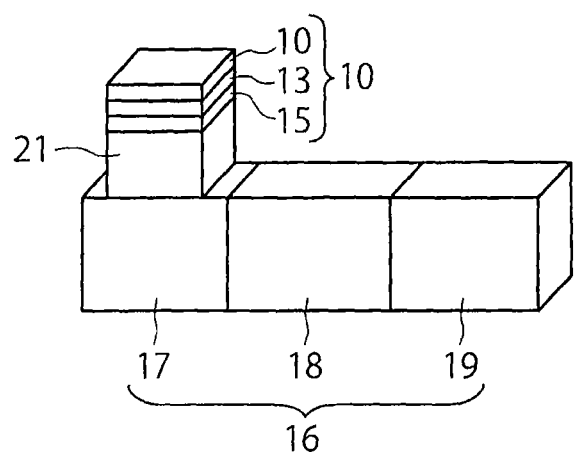
FIG. 11 is a perspective view showing a memory cell of a resistive change memory according to a modification of the first embodiment.

Although a vertical structure is employed in the first embodiment in which the N-P-N junction element 16 and the magnetoresistive element 10 are vertically stacked in the memory cell 1, a lateral structure may be employed for the N-P-N junction element 16 as in a memory cell 1A of a spin transfer torque magnetic memory according to a modification shown in FIG. 11. The memory cell 1A of the spin transfer torque magnetic memory according to the modification includes an N-P-N junction element 16 and a magnetoresistive element 10, the N-P-N junction element 16 being disposed on a semiconductor region (not shown) and including an N-type semiconductor layer 17, a P-type semiconductor layer 18, and an N-type semiconductor layer 19 arranged in a horizontal direction that is perpendicular to the stacking direction of respective layers of the magnetoresistive element 10, and the magnetoresistive element 10 having a multilayer structure including a ferromagnetic layer 11, a nonmagnetic layer 13, and a ferromagnetic layer 15 stacked on the n-type semiconductor layer 17 via a metal layer 21. The metal layer 21 is used to reduce the contact resistance, and may be formed of a low-resistance barrier metal such as Ti, TiN, and W.

Figure 12A:
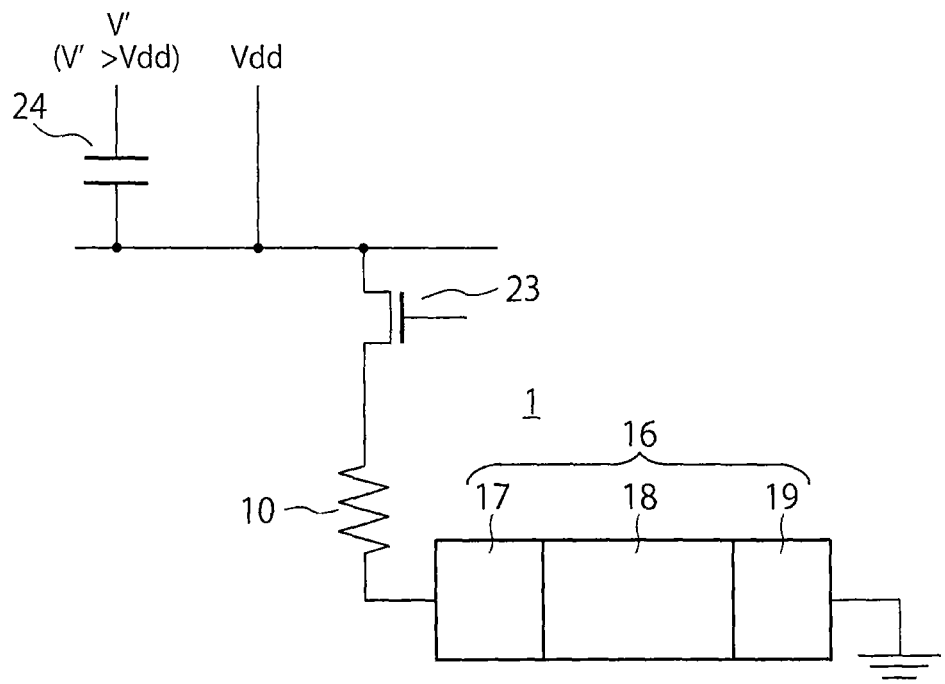
FIGS. 12A and 12B are diagrams showing a specific example of a read unit used in a read operation.

Various methods may be used to apply the two-stage pulsed voltage shown in FIG. 7. A simple voltage applying device (read unit) is illustrated in FIG. 12A as an example. A first power supply for supplying a first voltage V' and a second power supply for supplying a second voltage Vdd are connected to the memory cell 1 via a switch 23 such as a MOSFET. A capacitor 24 is disposed between the first power supply and the memory cell 1. The relationship between the first voltage V' and the second voltage Vdd is assumed to be V'>Vdd.

Figure 12B:
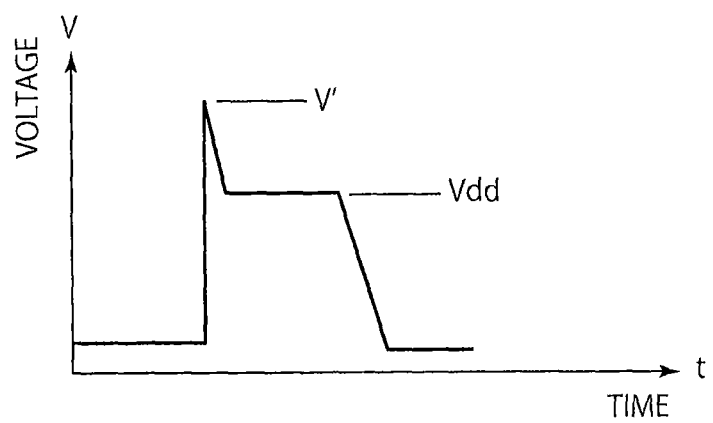

If the switch 23 such as a MOSFET is turned ON in this voltage applying device (read unit), the first voltage V' is initially applied to the memory cell 1, but as considerable time passes, the first power supply and the memory cell 1 are decoupled from each other by the capacitor 24. As a result, the first voltage V' is no longer applied to the memory cell 1, but the second voltage Vdd is applied thereto. The waveform of the applied voltages is shown in FIG. 12B.

Figure 13:
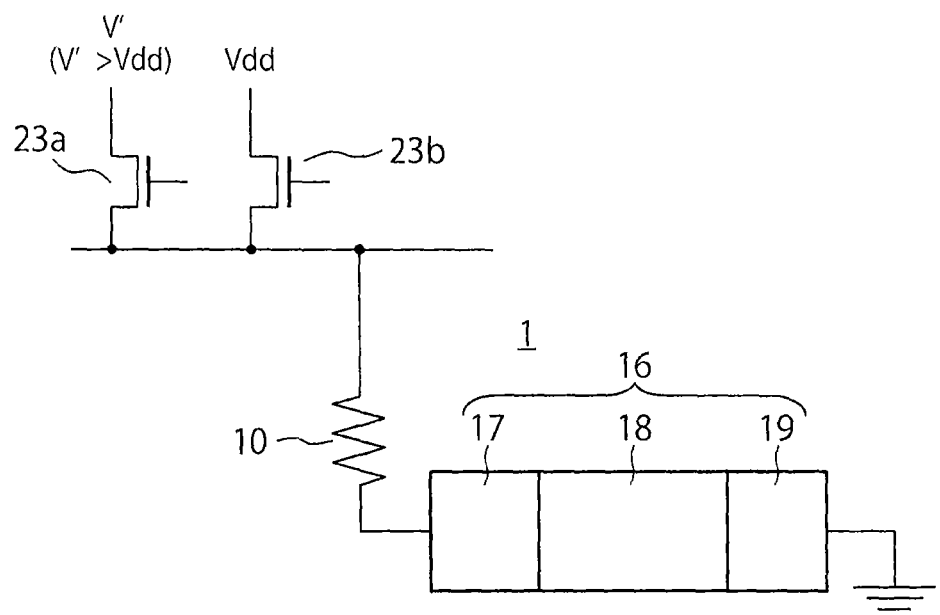
FIG. 13 is a diagram showing another specific example of the read unit used for the read operation.

A first voltage and a second voltage may be applied easily and sequentially to the memory cell 1 using the voltage applying device (read unit) as described above. Another type of voltage applying device (read unit) may also be employed, in which the capacitor 24 is not used but switches 23a, 23b such as MOSFETs are connected in series to the first power supply and the second power supply, respectively, as shown in FIG. 13, and two-stage pulsed voltage is applied by turning ON or OFF these switches.

As described above, according to the first embodiment its modifications, a resistive change memory with a high resistance change rate can be provided.

Second Embodiment

Figure 14:
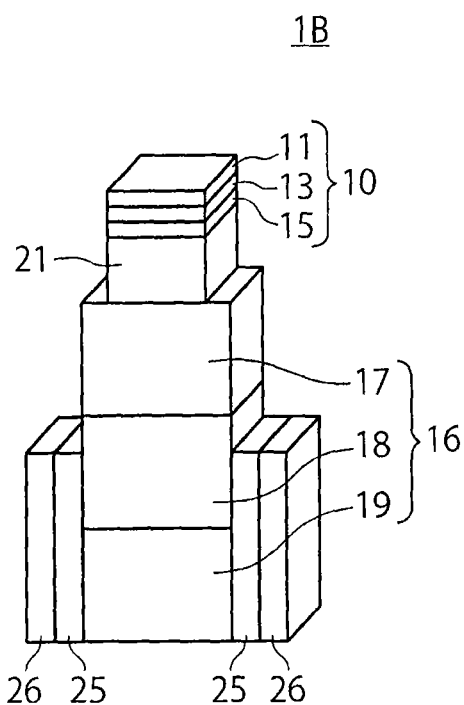
FIG. 14 is a perspective view showing a memory cell of a resistive change memory according to a second embodiment.

A resistive change memory according to a second embodiment will be described with reference to FIG. 14. The resistive change memory according to the second embodiment is a spin transfer torque magnetic memory including at least one memory cell, which is shown in FIG. 14. FIG. 14 is a perspective view of a memory cell 1B of the spin transfer torque magnetic memory according to the second embodiment. The memory cell 1B is disposed on a semiconductor substrate (not shown), and includes a magnetoresistive element 10, an N-P-N junction element 16 connected in series to the magnetoresistive element 10 via a metal layer 21, gate insulating films 25, and gate electrodes 26. The magnetoresistive element 10 includes a ferromagnetic layer 11, a nonmagnetic layer 13, and a ferromagnetic layer 15. The N-P-N junction element 16 includes an N-type semiconductor layer 17, a P-type semiconductor layer 18, and an N-type semiconductor layer 19. The ferromagnetic layer 15 of the magnetoresistive element 10 and the N-type semiconductor layer 17 of the N-P-N junction element 16 are connected to each other via the metal layer 21, but may be directly connected to each other as in the case shown in FIGS. 1A and 1B. The metal layer 21 is formed of a low-resistance barrier metal such as Ti, TiN, and W.

The magnetization direction of one of the ferromagnetic layer 11 and the ferromagnetic layer 15 in the magnetoresistive element 10 is switchable, and the magnetization direction of the other is fixed. In the second embodiment, the magnetization direction of the ferromagnetic layer 11 and the ferromagnetic layer 15 is substantially perpendicular to the film plane, but they may be substantially parallel to the film plane.

The gate insulating films 25 are disposed on part or all of a pair of side surfaces of the N-P-N junction element 16, and sandwiched by the gate electrodes 26 in the second embodiment as shown in FIG. 14. The gate electrode 26 controls the carrier concentration of at least one of the N-type semiconductor layers and the p-type semiconductor layer. This provides a function as a selection transistor to the N-P-N junction element 16, and eliminates the need of the selection transistor for selecting a memory cell when a plurality of the memory cells shown in FIG. 14 form a memory cell array.

The method of reading the memory cell according to the second embodiment is the same as that of the first embodiment, and two-stage pulsed voltage is applied to read the memory cell 1B.

The write method includes a step of applying a voltage to the gate electrodes 26, with which the P-type semiconductor layer 18 is not inverted, to increase the carrier concentration in the P-type semiconductor layer 18 covered by the gate electrodes, followed by the write method described with reference to the first embodiment.

The N-P-N junction element 16 of the second embodiment shown in FIG. 14 has a vertical structure in which the respective layers thereof are stacked vertically relative to the magnetoresistive element 10. The N-P-N junction element 16, however, may have a lateral structure as in the case of the memory cell of the spin transfer torque magnetic memory according to a modification of the second embodiment shown in FIG. 15. The memory cell 1C of the spin transfer torque magnetic memory according to the modification includes an N-P-N junction element 16 and a magnetoresistive element 10, the N-P-N junction element 16 being disposed on a semiconductor region (not shown) and including an N-type semiconductor layer 17, a P-type semiconductor layer 18, and an N-type semiconductor layer 19 arranged in a horizontal direction that is perpendicular to the stacking direction of the respective layer of the magnetoresistive element 10, and the magnetoresistive element 10 being disposed on the N-type semiconductor layer 17 via a metal layer 21, and having a multilayer structure including a ferromagnetic layer 11, a nonmagnetic layer 13, and a ferromagnetic layer 15. A gate electrode 26 is disposed on a part of the top surface of the N-P-N junction element 16 with a gate insulating film 25 being sandwiched between the gate electrode 26 and the N-P-N junction element 16. Although the carrier concentration in the P-type semiconductor region is controlled by the gate voltage in the above example, the switching may be performed by controlling the carrier concentration of the N-type region, or both the N-type region and the P-type region by the gate voltage.

As in the case of the first embodiment, a resistive change memory with a high resistance change rate may be provided according to the second embodiment and its modification.

Third Embodiment

Figure 16:
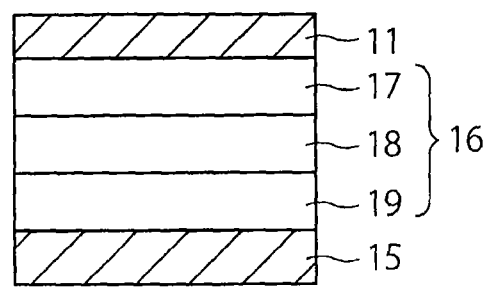
FIG. 16 is a perspective view of a memory cell of a resistive change memory according to a third embodiment.

A resistive change memory according to a third embodiment will be described with reference to FIG. 16. Unlike the first embodiment, the third embodiment does not include a nonmagnetic layer 13 as shown in the first embodiment shown in FIGS. 1A and 1B. The resistive change memory according to the third embodiment is a spin transfer torque magnetic memory including at least one memory cell, which is shown in FIG. 16. FIG. 16 is a perspective view showing a memory cell 1D of the spin transfer torque magnetic memory according to the third embodiment. The memory cell 1D includes an N-P-N junction element 16 and ferromagnetic layers 11, 15 disposed to sandwich the N-P-N junction element 16. The ferromagnetic layer 11 is directly connected to an N-type semiconductor layer 17 of the N-P-N junction element 16, and the ferromagnetic layer 15 directly is connected to an N-type semiconductor layer 19 of the N-P-N junction element 16. The magnetization direction of one of the ferromagnetic layer 11 and the ferromagnetic layer 15 is switchable, and the magnetization direction of the other is fixed. The magnetization direction of the ferromagnetic layer 11 and the ferromagnetic layer 15 in the third embodiment is substantially perpendicular to the film plane, but may be substantially parallel to the film plane.

One of the first ferromagnetic layer 11 and the second ferromagnetic layer 15 in the third embodiment is connected to the corresponding word line WL and the other is connected to the corresponding bit line BL shown in FIG. 8.

The write method and the read method for the memory cell 1D according to the third embodiment are the same as those for the memory cell 1 according to the first embodiment.

A P-N-P junction element may be used instead for the N-P-N junction element 16 in the third embodiment.

As in the second embodiment, gate insulating films may be disposed on a pair of opposite side surfaces of the N-P-N junction element 16, and gate electrodes may be disposed on the gate insulating films.

As in the case of the first embodiment, a resistive change memory with a high resistance change rate may be provided according to the third embodiment.

A spin transistor may be formed with the structure of one of the memory cells according to the first to third embodiments and their modifications.

The following materials may be employed in the first to third embodiments and their modifications.

Figure 15:
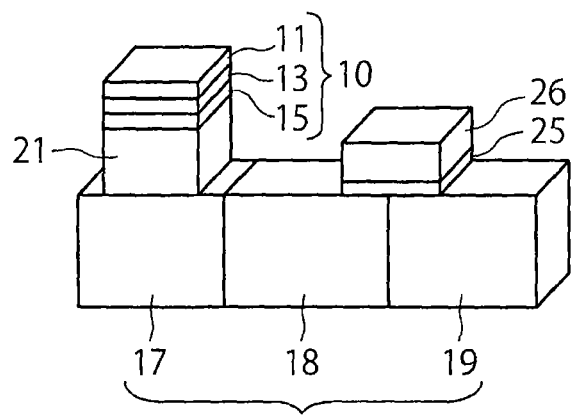
FIG. 15 is a perspective view showing a memory cell of a resistive change memory according to a modification of the second embodiment.

An N-type silicon layer or P-type silicon layer may be employed as each of the semiconductor layers 17, 18, 19 of the N-P-N junction element 16 or the P-N-P junction element of the memory cell 1. Furthermore, the group IV elements such as Ge, $Si_xGe_{1-x}$ (0<x<1), and C, compound semiconductors of the group III-V elements, compound semiconductors of the group II-VI elements, compound semiconductors of the group II-VI elements, and magnetic semiconductors may be employed. In the lateral structures as shown in FIGS. 11 and 15, a semiconductor layer disposed on an insulating material may also be used. This semiconductor layer may be formed of, for example, SOI, GOI, SiGe disposed on an insulating material, a group III-V element compound semiconductor disposed on an insulating material, a group IV element semiconductor such as graphene disposed on an insulating material, and a group II-VI element compound semiconductor disposed on an insulating material.

Each of the ferromagnetic layers 11, 15 preferably has one-directional anisotropy, and a thickness of 0.1 nm to 100 nm. Since the ferromagnetic layers should have a thickness so as not to become superparamagnetic, the thickness is more preferably 0.4 nm or more. The ferromagnetic layers may be formed of a Heusler alloy, such as $Co_2FeAl_{1-x}Si_x$ and $Co_2Mn_{1-x}Fe_xSi$.

Materials like Co, Fe, Ni, and an alloy thereof such as Co—Pt, Co—Fe—Pt, Fe—Pt, Co—Fe—Cr—Pt, Co—Cr—Pt, Co—Pd, NiMnSb, $Co_2MnGe$, $Co_2MnAl$, $Co_2MnSi$, and CoCrFeAl may also be used.

A magnetic material containing at least one magnetic semiconductor selected from the group consisting of GeMn, SiCNi, SiCMn, SiCFe, ZnMnTe, ZnCrTe, BeMnTe, ZnVO, ZnMnO, ZnCoO, GaMnAs, InMnAs, InMnAb, GaMnP, GaMnN, GaCrN, AlCrN, BiFeTe, SbVTe, PbSnMnTe, GeMnTe, CdMnGeP, ZnSiNMn, ZnGeSiNMn, BeTiFeO, CdMnTe, ZnMnS, TiCoO, SiMn, and SiGeMn may also be used.

A ferrite with a composition X—Fe—O (where X is one of Mn, Co, Ni, Cu, Zn, Ba, Sr, Pb and rare earth elements) such as Co—Fe—O may also be used.

A nonmagnetic element such as Ag (silver), Cu (copper), Au (gold), Al (aluminum), Ru (ruthenium), Os (Osmium), Re (rhenium), Ta (tantalum), B (boron), C (carbon), O (oxygen), N (nitrogen), Pd (palladium), Pt (platinum), Zr (zirconium), Ir (iridium), W (tungsten), Mo (molybdenum), Nb (niobium) may be added to the aforementioned magnetic materials to adjust the magnetic characteristics and other characteristics such as crystallinity, mechanical characteristics, and chemical characteristics.

The nonmagnetic layer 13 of the first and second embodiments may be formed of an oxide or nitride of Si, Ge, Al, Ga, Mg, and Ti, SrTiO, and NdGaO.

The nonmagnetic layer 13 of the first and second embodiments may contain at least one element selected from the group consisting of Cu, Ru, Cr, Au, Ag, Hf, Zr, Rh, Pt, Ir, Al, La, and Mg, or may be formed of an alloy or oxide thereof, or an oxide or nitride or Si, Ge, Al, Ga, Mg, Ti, SrTiO, NdGaO, $Si_xGe_{1-x}$ (0<x<1), a group III-V or group II-VI element compound semiconductor, or a magnetic semiconductor.

Fourth Embodiment

A resistive change memory according to a fourth embodiment will be described with reference to FIGS. 18 to 22. The resistive change memory according to the fourth embodiment is obtained by replacing the magnetoresistive element 10 of the resistive change memory 1 according to the first embodiment shown in FIGS. 1A and 1B with a magnetoresistive element 50 shown in FIG. 18. Data can be written to the resistive change memory according to the fourth embodiment with a one-directional current.

Figure 18:
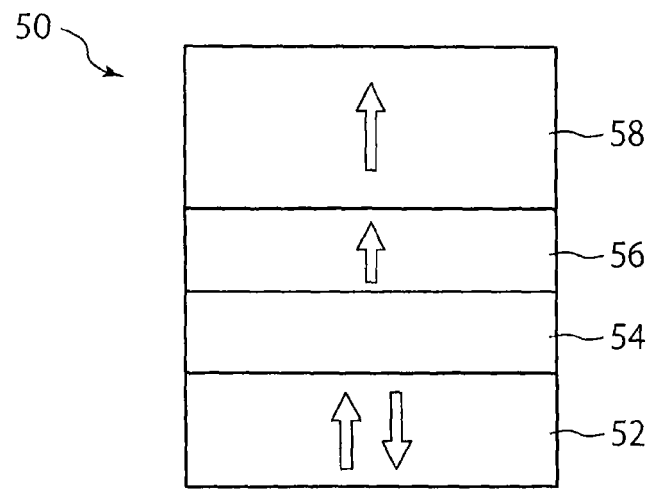
FIG. 18 is a cross-sectional view showing a magnetoresistive element according to a fourth embodiment.

FIG. 18 shows the magnetoresistive element 50.

The magnetoresistive element 50 includes a first ferromagnetic layer 52, a third ferromagnetic layer 58, a nonmagnetic layer 54 disposed between the first ferromagnetic layer 52 and the third ferromagnetic layer 58, and a second ferromagnetic layer 56 disposed between the third ferromagnetic layer 58 and the nonmagnetic layer 54. Arrows shown in FIG. 18 indicate the directions of magnetization. Each direction of magnetization is assumed to be perpendicular to the film plane, but may be parallel to the film plane. Another nonmagnetic layer 54 may also be disposed between the third ferromagnetic layer 58 and the second ferromagnetic layer 56.

The magnetization of the first ferromagnetic layer 52 is switchable. The first ferromagnetic layer 52 may be formed of, for example, an alloy of at least one element selected from the group consisting of Fe, Co, Ni, Mn, and Cr and at least one element selected from the group consisting of Pt, Pd, Ir, Ru, and Rh. Boron (B) may be added to the alloy. The first ferromagnetic layer 52 may have a multilayer structure. A nonmagnetic layer 54 may be disposed between adjacent two layers of the multilayer structure. The thickness of the first ferromagnetic layer 52 is 0.1 nm or more, and 100 nm or less.

The magnetization of the third ferromagnetic layer 58 is fixed to one direction. The third ferromagnetic layer 58 may be formed of, for example, an alloy of at least one element selected from the group consisting of Fe, Co, Ni, Mn, and Cr, and at least one element selected from the group consisting of Pt, Pd, Ir, Ru, and Rh. Boron (B) may be added to the alloy. The thickness of the third ferromagnetic layer 58 is 0.1 nm or more and 100 nm or less.

The nonmagnetic layer 54 may be formed of at least one element selected from the group consisting of Cu, Ru, Cr, Au, Ag, Hf, Zr, Rh, Pt, Ir, Al, La, and Mg, an alloy or oxide thereof, an oxide or nitride of Si, Ge, Al, Ga, and Mg, and Ti, SrTiO, NdGaO, $Si_xGe_{1-x}$ (0<x<1), a group III-V or group II-VI element compound semiconductor, or a magnetic semiconductor.

The second ferromagnetic layer 56 contains a half metal, and may be formed of, for example, a Heusler alloy or a magnetic semiconductor.

The Heusler alloy is, for example, $Co_2FeAl_{1-x}Si_x$ or $Co_2Mn_{1-x}Fe_xSi$ (0<x<1).

The magnetic semiconductor is, for example, GeMn, SiCNi, SiCMn, SiCFe, ZnMnTe, ZnCrTe, BeMnTe, ZnVO, ZnMnO, ZnCoO, GaMnAs, InMnAs, InMnAb, GaMnP, GaMnN, GaCrN, AlCrN, BiFeTe, SbVTe, PbSnMnTe, GeMnTe, CdMnGeP, ZnSiNMn, ZnGeSiNMn, BeTiFeO, CdMnTe, ZnMnS, TiCoO, SiMn, or SiGeMn. A nonmagnetic element such as Ag (silver), Cu (copper), Au (gold), Al (aluminum), Ru (ruthenium), Os (Osmium), Re (rhenium), Ta (tantalum), B (boron), C (carbon), O (oxygen), N (nitrogen), Pd (palladium), Pt (platinum), Zr (zirconium), Ir (iridium), W (tungsten), Mo (molybdenum), and Nb (niobium) may be added to the aforementioned magnetic semiconductors to adjust the magnetic characteristics and other characteristics such as crystallinity, mechanical characteristics, and chemical characteristics.

The second ferromagnetic layer 56 may be formed of Co, Fe, and Ni, or an alloy of these elements. Furthermore, materials like Co—Pt, Co—Fe—Pt, Fe—Pt, Co—Fe—Cr—Pt, Co—Cr—Pt, Co—Pd, NiMnSb, $Co_2MnGe$, $Co_2MnAl$, $Co_2MnSi$, and CoCrFeAl may also be employed.

The thickness of the second ferromagnetic layer 56 is 0.4 nm or more, and 5 nm or less so as not to make it superparamagnetic.

A nonmagnetic layer 54 may be disposed between the third ferromagnetic layer 58 and the second ferromagnetic layer 56. Each of the first ferromagnetic layer 52 and the third ferromagnetic layer 58 preferably has a uniaxial magnetic anisotropy.

Figure 19:
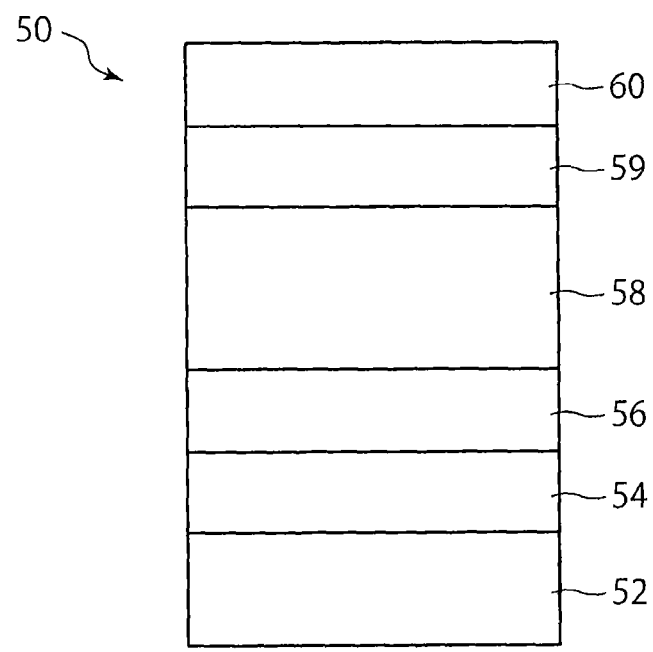
FIG. 19 is a cross-sectional view of a magnetoresistive element according a first modification of the fourth embodiment.

If the magnetization of the second ferromagnetic layer 56 should be directed to the in-plane direction, an antiferromagnetic layer 60 is disposed on the third ferromagnetic layer 58 via an intermediate layer 59 of Ru, as shown in FIG. 19. The antiferromagnetic layer 60 may be formed of, for example, Fe—Mn (iron-manganese), Pt—Mn (platinum-manganese), Pt—Cr—Mn (platinum-chromium-manganese), Ni—Mn (nickel-manganese), Ir—Mn (iridium-manganese), NiO (nickel oxide), or $Fe_2O_3$ (iron oxide). The magnetization of the second ferromagnetic layer 56 may be directed to the in-plane direction without the antiferromagnetic layer 60 by increasing the thickness of the third ferromagnetic layer 58 to, for example, 10 nm or more.

A layer of CoFe or CoFeB may be disposed between the first ferromagnetic layer 52 and the nonmagnetic layer 54, or between the first ferromagnetic layer 52 and the second ferromagnetic layer 56.

The principles of operation of the magnetoresistive element 50 will then be described.

Figure 20A:
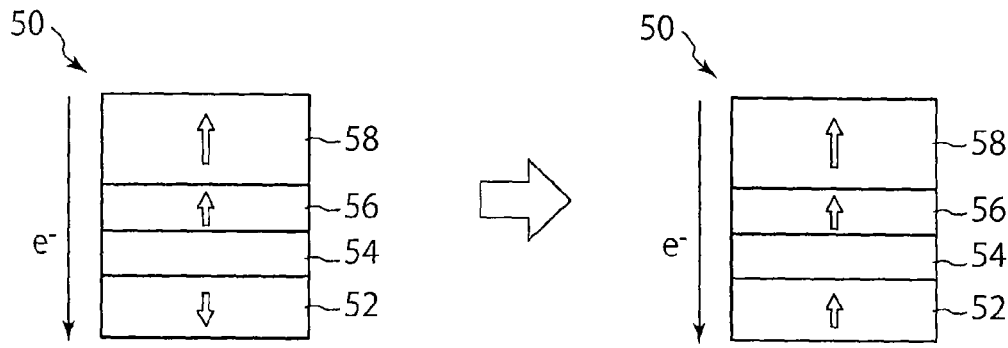
FIGS. 20A and 20B are explanatory diagrams illustrating a write method for the magnetoresistive element according to the fourth embodiment.
Figure 20B:
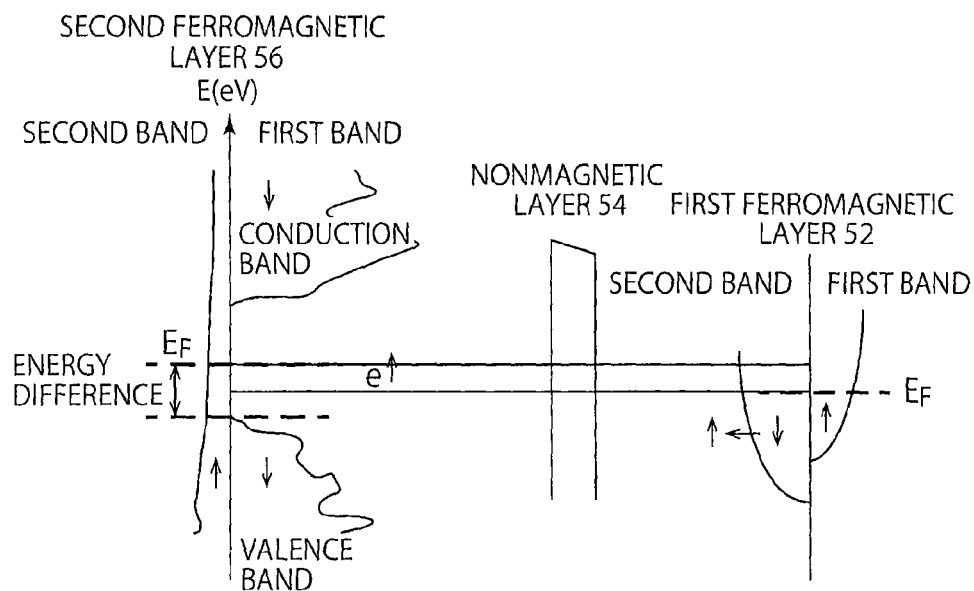

FIGS. 20A and 20B are explanatory diagrams illustrating a write operation of the magnetoresistive element 50.

As shown in FIG. 20A, the magnetizations of the first ferromagnetic layer 52, the second ferromagnetic layer 56, and the third ferromagnetic layer 58 are perpendicular to the film plane. It is assumed that the magnetization in the first ferromagnetic layer 52 is downward as shown in FIG. 20A (down spin) while the magnetizations of the third ferromagnetic layer 58 and the second ferromagnetic layer 56 are upward (up spin).

If electrons are caused to flow from the third ferromagnetic layer 58 to the first ferromagnetic layer 52 as shown in FIG. 20A, the electrons receive spin information of the second ferromagnetic layer 56, and convey the spin information to the first ferromagnetic layer 52 via the nonmagnetic layer 54. This causes the electrons, which initially have down spin, to have up spin in the first ferromagnetic layer 52.

This phenomenon will be explained below.

FIG. 20B is a diagram showing energy in each of the second ferromagnetic layer 56, the nonmagnetic layer 54, and the first ferromagnetic layer 52. The second ferromagnetic layer 56 is formed of a half metal. The first ferromagnetic layer 52 is formed of a ferromagnetic material. It is assumed in FIG. 20B that the second band of the second ferromagnetic layer 56 has up spin, and the second band of the first ferromagnetic layer 52 has down spin.

The second band of the second ferromagnetic layer 56 is continuous from a low energy region to a high energy region. The first band of the second ferromagnetic layer 56 includes a conduction band and a valence band. The second band is continuous at least from the valence band to the conduction band.

Electrons around the Fermi level $E_F$ of the second ferromagnetic layer 56 contribute to electrical conduction. As can be understood from FIG. 20B, it is the second band that has electrons around the Fermi level $E_F$. Therefore, the up-spin electrons present in the second band of the second ferromagnetic layer 56 switches the spin direction in the first ferromagnetic layer 52.

However, if a voltage corresponding to an energy that is greater than the energy difference between the Fermi level $E_F$ and the band end of the valence band of the first band is applied to the second ferromagnetic layer 56, electrons in the valence band of the first band become to contribute the electrical conduction since the Fermi level $E_F$ varies for the amount corresponding to the applied voltage. Therefore, a voltage corresponding to an energy below the above energy difference is applied between the first ferromagnetic layer 52 and the third ferromagnetic layer 58. This voltage will be called first voltage.

Applying the first voltage between the first ferromagnetic layer 52 and the third ferromagnetic layer 58 causes electrons to flow from the third ferromagnetic layer 58 to the first ferromagnetic layer 52. This rewrites the magnetization information of the first ferromagnetic layer 52 by the spin in the second band. The voltage is controlled so that the potential of the third ferromagnetic layer 58 is higher than that of the first ferromagnetic layer 52.

In a read operation, a voltage lower than the first voltage is applied between the first ferromagnetic layer 52 and the third ferromagnetic layer 58 to cause electrons to flow from the third ferromagnetic layer 58 to the first ferromagnetic layer 52. Since the direction of magnetization of the first ferromagnetic layer 52 is substantially parallel to that of the third ferromagnetic layer 58, the resistance therebetween is low.

Figure 21A:
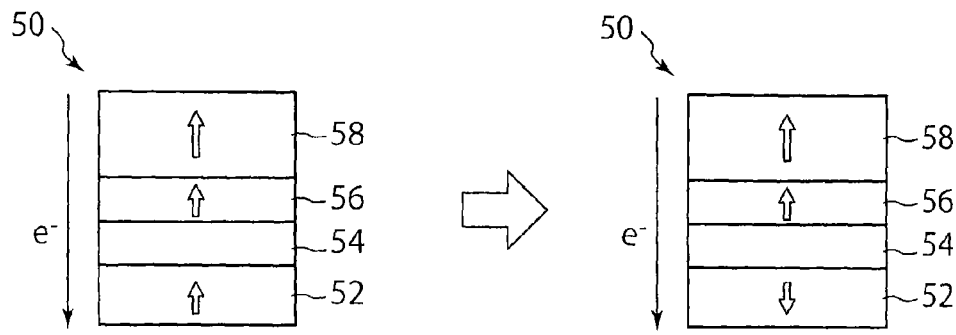
FIGS. 21A and 21B are explanatory diagrams illustrating a write method for the magnetoresistive element according to the fourth embodiment.
Figure 21B:
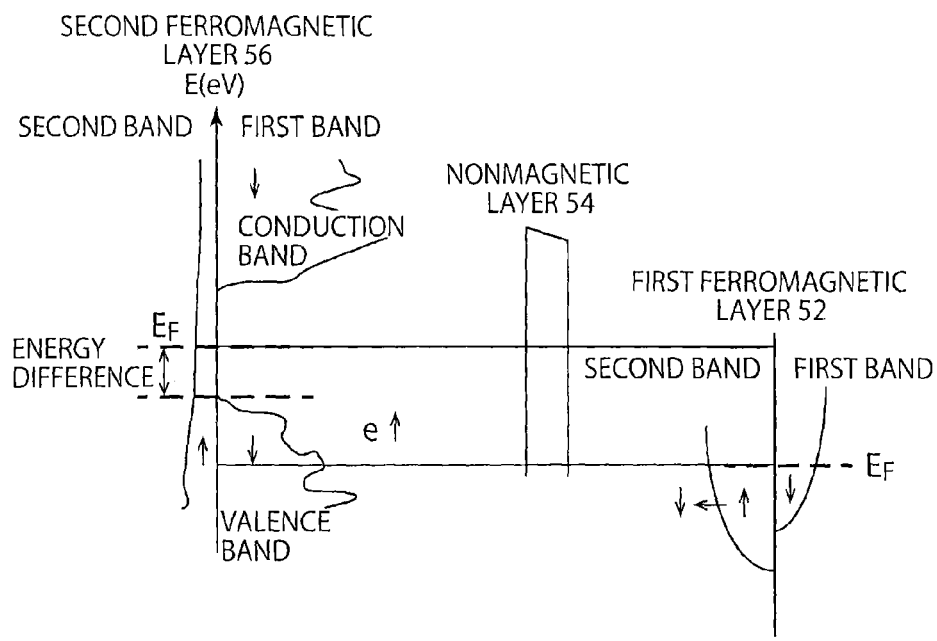

The case where the magnetization of the first ferromagnetic layer 52 is in the up spin direction as shown in FIG. 21A will be described below. If the direction of magnetization in the first ferromagnetic layer 52 is intended to be switched to the down spin direction, a voltage corresponding to an energy greater than the energy difference between the Fermi level $E_F$ and the band end of the valence band of the first band is applied to the second ferromagnetic layer 56 to cause electrons to flow from the third ferromagnetic layer 58 to the first ferromagnetic layer 52 as shown in FIG. 21B. This voltage will be called second voltage. The number of electrons in the valence band of the first band becomes greater than that in the second band in the second ferromagnetic layer 56 at this time. This causes electrons in the first band of the second ferromagnetic layer 56 contribute to the electric conduction. Therefore, the down spin in the second ferromagnetic layer 56 switches the up spin of the first ferromagnetic layer 52 to the down spin. The voltage is controlled so that the potential of the third ferromagnetic layer 58 becomes greater than that of the first ferromagnetic layer 52.

In the energy level at the end of the valence band of the first band of the second ferromagnetic layer 56 in FIG. 21B, the density of state of the second band is greater than that of the first band. Actually, the density of state of the second band is smaller. Therefore, if a voltage corresponding to an energy greater than the energy difference between the Fermi level $E_F$ and the band end of the valence band of the first band is applied to the second ferromagnetic layer 56 to cause electrons to flow from the third ferromagnetic layer 58 to the first ferromagnetic layer 52, the electrons in the first band of the second ferromagnetic layer 56 contribute to the electrical conduction.

In a read operation, a voltage lower than the second voltage is applied between the first ferromagnetic layer 52 and the third ferromagnetic layer 58 to cause electrons to flow from the third ferromagnetic layer 58 to the first ferromagnetic layer 52. Since the direction of magnetization in the first ferromagnetic layer 52 is substantially antiparallel to that of the third ferromagnetic layer 58, a high resistance value can be obtained.

For example, if the second ferromagnetic layer 56 is formed of $Co_2FeAl_{0.5}Si_{0.5}$, a voltage of 0.6 V or less causes the electrons in the second band of the second ferromagnetic layer 20 to contribute to electrical conduction. A voltage of 0.6 V or more causes electrons of the first band in the second ferromagnetic layer 56 to contribute to electrical conduction. If the second ferromagnetic layer 56 is formed of $Co_2Mn_{0.5}Fe_{0.5}Si$, a voltage of less than 0.5 V would cause electrons in the second band of second ferromagnetic layer 56 to contribute to electrical conduction. If electrons in the first band of the second ferromagnetic layer 56 are intended to contribute to electrical conduction, a voltage of 0.5 V or more would be employed. The aforementioned voltage values are just examples. Therefore, voltage values may vary depending on the design of the magnetoresistive element 50.

Ideally, the half metal contained in the second ferromagnetic layer 56 is completely crystallized. However, it may not be fully crystallized. This means that electrons in the first band are allowed to contribute to electrical conduction to some extent when electrons in the second band mainly contribute to the electrical conduction. On the contrary, electrons in the second band may contribute to the electrical conduction when electros in the first band mainly contribute to the electrical conduction.

The explanation has been made on the condition that the electrons in the second band of the first ferromagnetic layer 52 contribute to the operation. However, the electrons in the first band of the first ferromagnetic layer 52 may contribute to the electrical conduction. The difference therebetween is caused by the number of electrons in the Fermi level $E_F$.

The explanation has been made on the condition that the second band of the second ferromagnetic layer 56 is continuous, and the first band of the second ferromagnetic layer 56 includes the conduction band and the valence band. However, the second band of the second ferromagnetic layer 56 may include the conduction band and the valence band, and the first band of the second ferromagnetic layer 56 may be continuous.

Figure 22:
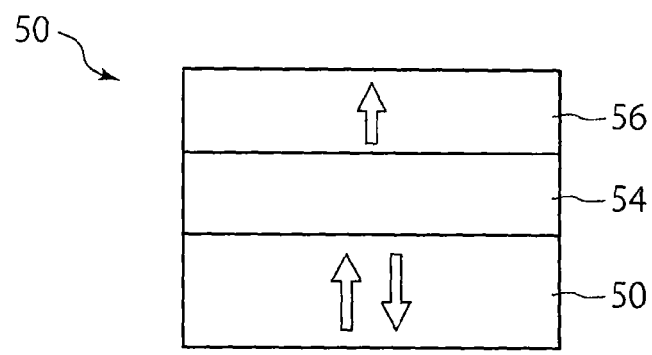
FIG. 22 is a cross-sectional view showing a magnetoresistive element according to a second modification of the fourth embodiment.

It has been assumed that the magnetoresistive element 50 includes the second ferromagnetic layer 56. However, the third ferromagnetic layer 58 may be eliminated, and a nonmagnetic layer 54 may be disposed between the second ferromagnetic layer 56 and the first ferromagnetic layer 52 as shown in FIG. 22.

Like the first embodiment, a resistive change memory with a high resistance change rate may be provided according to the fourth embodiment.

Fifth Embodiment

Figure 23:
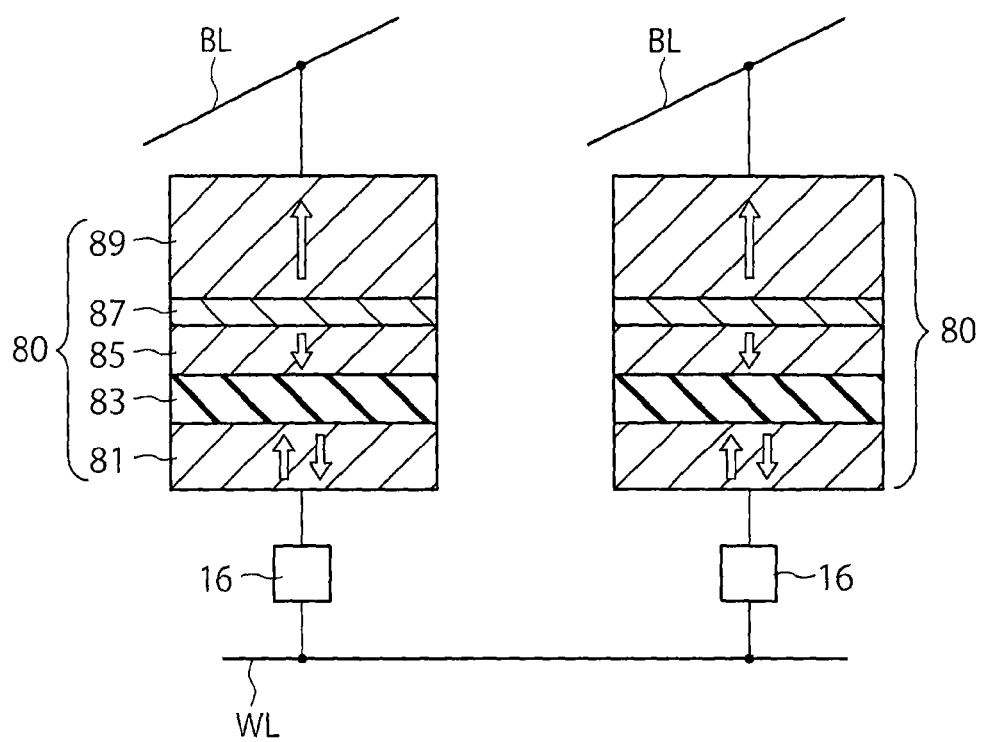
FIG. 23 is a cross-sectional view showing a resistive change memory according to a fifth embodiment.

FIG. 23 shows a resistive change memory according to a fifth embodiment. The resistive change memory according to the fifth embodiment includes a plurality of (two in FIG. 23) memory cells 70 arranged in a matrix form. The memory cell 70 includes a ferromagnetic multilayer film 80 and a diode (for example n-p-n junction element) 16. The ferromagnetic multilayer film 80 includes a multilayer structure in which a ferromagnetic layer 81, a nonmagnetic layer 83, a ferromagnetic layer 85, a nonmagnetic layer 87, and a ferromagnetic layer 89 are stacked in this order. Each of the ferromagnetic layer 81, the ferromagnetic layer 85, and the ferromagnetic layer 89 has an easy magnetization axis that is substantially perpendicular to the film plane. Therefore, when no external magnetic field is applied, the magnetization in each ferromagnetic layer is substantially perpendicular to the film plane. The magnetic field for switching the magnetization of the ferromagnetic layers 81, 85 is less than that of the ferromagnetic layer 89. The ferromagnetic layer 89 and the ferromagnetic layer 85 are in antiferromagnetic magnetic exchange coupling with each other via the nonmagnetic layer 87, and the direction of magnetization in the ferromagnetic layer 89 is opposite to (antiparallel to) that of the ferromagnetic layer 85. Therefore, if the direction of magnetization in the ferromagnetic layer 89 is upward, the direction of magnetization in the ferromagnetic layer 85 is downward as shown in FIG. 23.

The anode of the diode 16 is electrically connected to a word line WL, and the cathode thereof is electrically connected to the ferromagnetic layer 81. The ferromagnetic layer 89 is connected to a bit line BL. Thus, a crosspoint architecture is constituted for each memory cell 70 in which one of the terminals is connected to the word line WL, and the other to the bit line BL. A low-resistance metal layer of a barrier metal such as Ti, TiN, and W for reducing the contact resistance may be disposed between the anode of the diode 70 and the word line WL, and between the cathode of the diode 70 and the ferromagnetic layer 81.

Although the anode of the diode 16 is connected to the word line WL and the cathode is connected to the ferromagnetic layer 81 in FIG. 23, the diode 16 may be connected on the bit line BL side with the cathode thereof being connected to the bit line BL and the anode thereof being connected to the ferromagnetic layer 89.

A write method for a memory cell of the resistive change memory according to the fifth embodiment will be described with reference to FIGS. 24 to 26.

Figure 24:
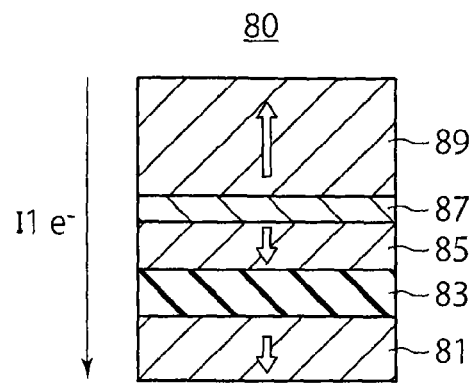
FIG. 24 is an explanatory cross-sectional view illustrating a write method to cause the resistive change memory of the fifth embodiment to be in a low-resistance state.

If electrons are caused to flow from the ferromagnetic layer 89 to the ferromagnetic layer 81 with the magnitude of the current of I1 (>0) as shown in FIG. 24, the relative magnetization directions of the ferromagnetic layer 81 and the ferromagnetic layer 85 become substantially parallel to each other due to the spin transfer torque magnetization switching principle (FIG. 24). The arrow in FIG. 24 indicates the direction of electrons, and the current I1 flows in the opposite direction. The magnitude of the current I1 at this time does not break the antiferromagnetic magnetic exchange coupling between the ferromagnetic layer 85 and the ferromagnetic layer 89. If a current I2 (>0) that is substantially lower than the current I1 (so that the spin transfer torque magnetization switching does not occur) is caused to flow in this state to read the resistance of the memory cell, the resistance of the ferromagnetic multilayer film 80, i.e. the memory cell 70, becomes low since the relative magnetization direction of the ferromagnetic layer 85 is substantially parallel to that of the ferromagnetic layer 81.

Next, a write method will be described below in a case where the magnitude of current is greater than I1.

Since the ferromagnetic layer 89 and the ferromagnetic layer 85 are in contact with each other via the nonmagnetic layer 87, the spin transfer torque magnetization switching can be performed between the ferromagnetic layer 89 and the ferromagnetic layer 85 by selecting appropriate materials for the ferromagnetic layers 89, 85 and the nonmagnetic layer 87, and selecting an appropriate thickness of the nonmagnetic layer 87. If a current I3 (>0) higher than the current I1 with a magnitude that does not cause the spin transfer torque magnetization switching in the ferromagnetic layer 85 is caused to flow between the ferromagnetic layer 89 and the ferromagnetic layer 81 in this state, the spin transfer torque magnetization switching is induced between the ferromagnetic layer 89 and the ferromagnetic layer 85, thereby causing the magnetization direction of the ferromagnetic layer 89 to be relatively substantially parallel to (in the same direction as) the magnetization direction of the ferromagnetic layer 85 (FIG. 25). The arrow in FIG. 25 indicates the direction along which electrons flow. The current I3 flows in a direction opposite to the direction of the arrow.

The spin transfer torque magnetization switching is induced between the ferromagnetic layer 85 and the ferromagnetic layer 81 via the nonmagnetic layer 83. Therefore, the magnetization direction of the ferromagnetic layer 85 is relatively antiparallel to that of the ferromagnetic layer 81 (FIG. 25). Although the current I3 is defined as causing the spin transfer torque magnetization switching in the ferromagnetic layer 85, it can be defined as changing the antiferromagnetic magnetic exchange coupling between the ferromagnetic layer 89 and the ferromagnetic layer 85 to the ferromagnetic magnetic exchange coupling.

Figure 25:
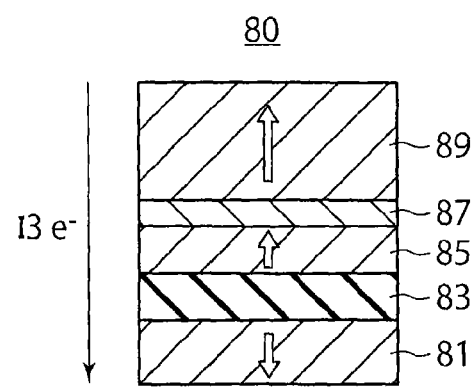
FIG. 25 is an explanatory cross-sectional view of a write method to cause the resistive change memory according to the fifth embodiment to be in a high-resistance state.
Figure 26:
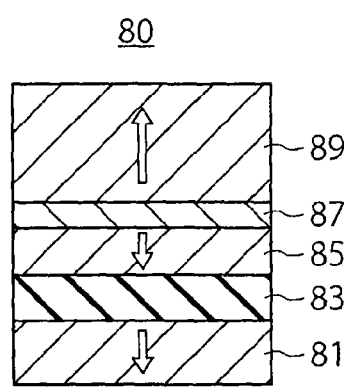
FIG. 26 is an explanatory cross-sectional view of a write method to cause the resistive change memory according to the fifth embodiment to be in a high-resistance state.

It is assumed that the current is shut down in the state shown in FIG. 25. Since the ferromagnetic layer 89 and the ferromagnetic layer 85 is in the antiparallel magnetic exchange coupling relationship via the nonmagnetic layer 87, if no current flows, the magnetization direction of the ferromagnetic layer 89 becomes relatively substantially antiparallel to that of the ferromagnetic layer 85. Thus, if the current is shut down, the direction of magnetization of the ferromagnetic layer 85 is switched to the opposite direction. This makes the magnetization direction of the ferromagnetic layer 85 relatively substantially antiparallel to that of the ferromagnetic layer 89 as shown in FIG. 26. Since no current flows through the ferromagnetic multilayer film 80 at this time, the direction of magnetization in the ferromagnetic layer 81 does not change. If the resistance of the memory cell in this state is read by the current I2 that is considerably lower than the current I1 (so that the spin transfer torque magnetization switching does not occur), the resistance of the ferromagnetic multilayer film 80, i.e., that of the memory cell 70, becomes high since the magnetization direction of the ferromagnetic layer 83 is relatively substantially antiparallel to that of the ferromagnetic layer 81.

As described above, it is possible to switch, with a one-directional current, the magnetization state of the ferromagnetic layer 81 in the memory cell 70, i.e., to change the state of the memory cell from the low-resistance state to the high-resistance state.

The relative magnetization directions of the ferromagnetic layer 81 and the ferromagnetic layer 85 after the write current I1 or I3 flows can be set to those of the high-resistance state or low-resistance state by appropriately selecting the materials of the ferromagnetic layer 81 and the ferromagnetic layer 85. For example, a combination of different metal magnetic materials, one with minority spin density of state and the other with majority spin density of state at the Fermi level, may be used for the ferromagnetic layer 81 and the ferromagnetic layer 85.

A verify write method may be employed to check whether a desired writing process is correctly performed. Specifically, after a write operation is performed using the write current I1 or I3, the magnetization direction of the memory cell on which the write operation is performed may be read using a read current lower than the write current I1 or I3 to determine whether the write operation is performed in a desired manner, and if not, the write operation may be performed again using the write current used. If the write operation is not performed in a desired manner, the width of the write pulse may be increased or the writing may performed a plurality of times to improve the probability that the desired writing may be performed. The writing operation may be repeated with an increased or decreased level of write current, depending on the read result. For example, if the writing is not successful with the current I3, the writing may be performed again with a current higher than the current I3, and if the writing is not successful with the current I1, the writing may be performed again with a current lower than the current I1.

As described above, according to the fifth embodiment, the writing may be performed with a one directional current, and an increase in circuit area may be prevented with the cross-point architecture.

Figure 27:
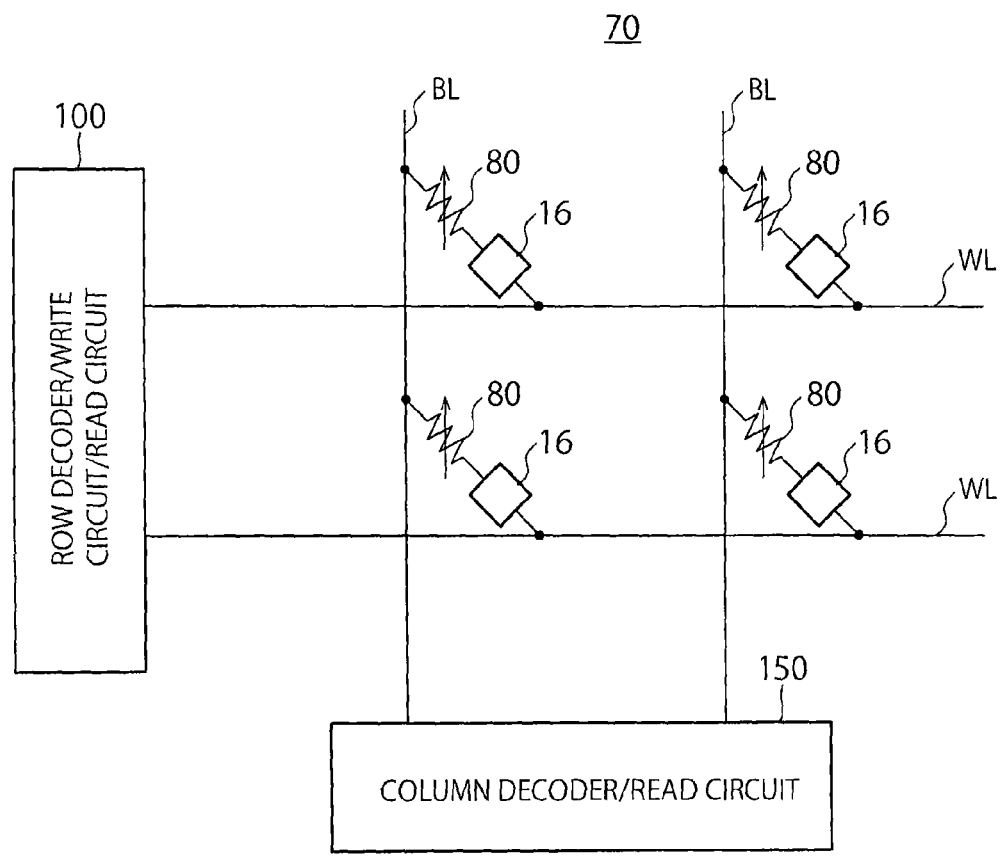
FIG. 27 is a circuit diagram showing a specific example of a circuit configuration of the resistive change memory according to the fifth embodiment.

FIG. 27 shows a specific example of a circuit configuration of the resistive change memory according to the fifth embodiment. The resistive change memory includes memory cells 70 arranged in a matrix form, a plurality of word lines WL, a plurality of bit lines BL crossing the word lines, a row decoder/write circuit/read circuit 100, and a column decoder/read circuit 150. Each memory cell 70 is disposed near an intersection region of one of the word lines WL and one of the bit lines BL, and includes the diode 16 and the ferromagnetic multilayer film 80 shown in FIG. 23.

Figure 28:
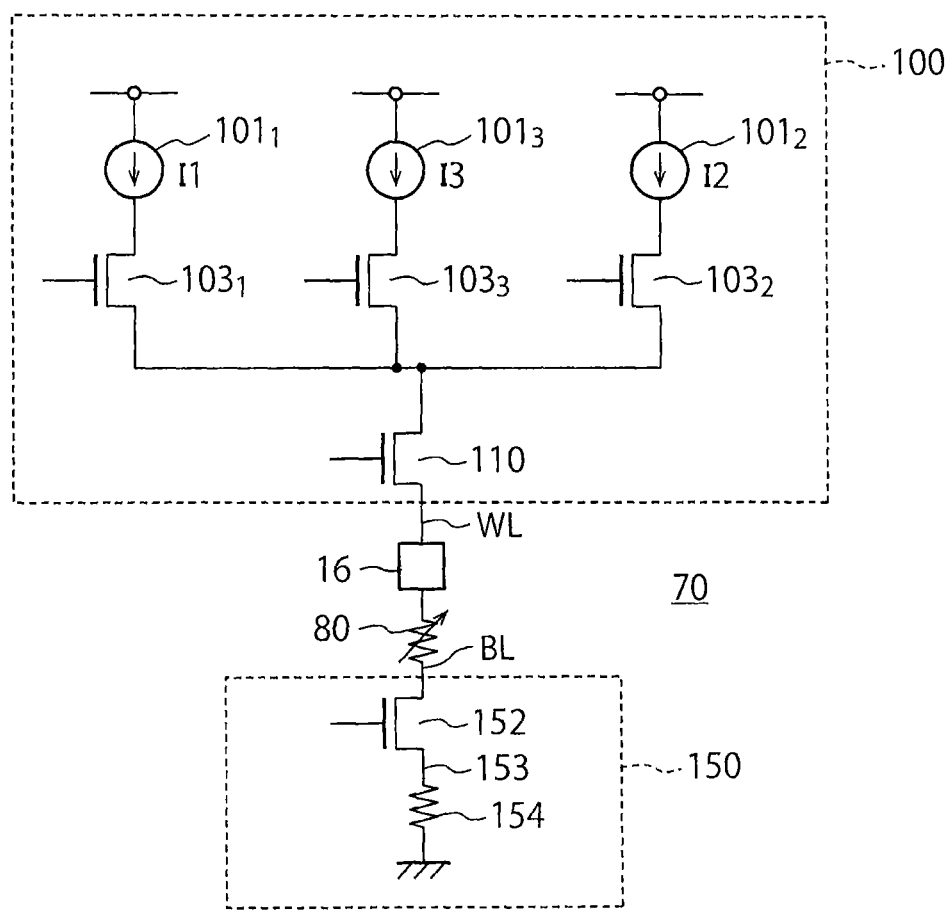
FIG. 28 is a circuit diagram showing a specific example of a write circuit and a read circuit of the resistive change memory according to the fifth embodiment.

FIG. 28 shows a specific example of the row decoder/write circuit/read circuit 100, and the column decoder/read circuit 150. The row decoder/write circuit/read circuit 100 includes three current sources $101_1$, $101_2$, $101_3$, three switches $103_1$, $103_2$, $103_3$ of, for example, p-type MOS transistors, and a selection transistor 110 of, for example, n-type MOS transistor corresponding to one of the word lines WL. It is assumed that the magnitudes of currents generated by the current sources $101_1$, $101_2$, $101_3$ are I1, I2, and I3, respectively, and I2<I1<I3.

The current source $101_1$ and the switch $103_1$ are connected in series with each other to form a first series circuit, the current source $101_2$ and the switch $103_2$ are connected in series to form a second series circuit, and the current source $101_3$ and the switch $103_3$ are connected in series to form a third series circuit. The first series circuit and the third series circuit constitute a write circuit, and the second series circuit constitutes a read circuit. Each of the first to third series circuits is connected to one terminal of the selection transistor 110. The other terminal of the selection transistor 110 is connected to the corresponding word line WL.

The column decoder/read circuit 150 includes a selection transistor 152 of n-type MOS transistor corresponding to one of the bit lines BL, and a resistance 154. One terminal of the selection transistor is connected to the corresponding bit line BL, and the other terminal is grounded via the resistance 154.

The operation of the resistive change memory according to the fifth embodiment with the above-described configuration will be described below.

First, a write operation to change the magnetization direction of the ferromagnetic layer 81 in the memory cell 70 to that shown in FIG. 24 using the current intensity I1 will be described below. The row decoder/write circuit/read circuit 100 sends a control signal to the gate of the selection transistor 110 to turn it ON, and the column decoder/read circuit 150 sends a control signal to the gate of the selection transistor 152 to turn it ON, thereby selecting a memory cell 70 on which the write operation is performed. Subsequently, the row decoder/write circuit/read circuit 100 sends a control signal to the gate of the switch $103_1$ to turn it ON. As a result, the write current I1 flows from the current source $101_1$ to the selected memory cell 70 via the switch $103_1$, and the writing is performed on the memory cell to have the magnetization direction shown in FIG. 24. The writing operation is terminated if the row decoder/write circuit/read circuit 100 sends a control signal to the gate of the switch $103_1$ to turn it OFF.

Next, a write operation to change the magnetization direction of the ferromagnetic layer 21 in the memory cell 70 to the magnetization direction shown in FIG. 26 using the current intensity I3 will be described. The memory cell on which the write operation is performed is selected in the same manner as described above. Subsequently, the row decoder/write circuit/read circuit 100 sends a control signal to the gate of the switch $103_3$ to turn in ON. As a result, the write current I3 flows from the current source $101_3$ to the selected memory cell 70 via the switch $103_3$ to perform the write operation to set the magnetization direction shown in FIG. 26 in the selected memory cell. The write operation is terminated if the row decoder/write circuit/read circuit 100 sends a control signal to the gate of the switch $103_3$ to turn it OFF.

The read operation will be described below. The memory cell on which the read operation is performed is selected in the same manner as described above. Subsequently, the row decoder/write circuit/read circuit 100 sends a control signal to the gate of the switch $103_2$ to turn it ON. As a result, the read current I2 flows from the current source $101_2$ to the selected memory cell 70 via the switch $103_2$. A voltage corresponding to the magnetization direction of the ferromagnetic layer 81 in the selected memory cell 70 appears on a connection node 153 between the selection transistor 152 and the resistance 154 at this time, and whether the selected memory cell 70 is in a high-resistance state or low-resistance state can be determined by reading the voltage of the connection node 153. The device for reading the voltage of the connection node 153 and the device for determining whether the selected memory cell 70 is in a high-resistance state or low-resistance state based on the voltage are not shown in FIG. 28, but included in the column decoder/read circuit 150.

According to the fifth embodiment, a resistive change memory with a high resistance change rate can be provided as in the case of the first embodiment.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

The invention claimed is:

1. A resistive change memory comprising:
    a memory cell including a resistive change element and a semiconductor element, the resistive change element comprising a first terminal and a second terminal, the semiconductor element comprising a first semiconductor layer of a first conductivity type, a second semiconductor layer of the first conductivity type, and a third semiconductor layer of a second conductivity type that is different from the first conductivity type, the third semiconductor layer being disposed between the first semiconductor layer and the second semiconductor layer, the first semiconductor layer being connected to the second terminal of the resistive change element; and
    a read unit configured to perform a read operation by applying a first read voltage greater than zero between the first terminal of the resistive change element and the second semiconductor layer of the semiconductor element, and then applying a second read voltage greater than zero that is lower than the first read voltage between the first terminal of the resistive change element and the second semiconductor layer of the semiconductor element.

2. The memory according to claim 1, wherein the resistive change element is a magnetoresistive element including a first ferromagnetic layer, a second ferromagnetic layer, and a nonmagnetic layer disposed between the first ferromagnetic layer and the second ferromagnetic layer.

3. The memory according to claim 1, wherein the semiconductor element is a vertical semiconductor element, and wherein the resistive change memory further comprises a gate electrode disposed on at least a part of a side surface of the semiconductor element, and a gate insulating film disposed between the gate electrode and the part of the side surface of the semiconductor element.

4. The memory according to claim 1, wherein the semiconductor element is a lateral semiconductor element, and wherein the resistive change memory further comprises a gate electrode disposed on at least a part of a top face of the semiconductor element, and a gate insulating film disposed between the gate electrode and the part of the top face of the semiconductor element.

5. The memory according to claim 1, wherein the memory cell further includes a selection transistor connected to the resistive change element or the semiconductor element.

6. The memory according to claim 1, wherein a recombination center of an electron and a hole is located at an interface between the first semiconductor layer and the third semiconductor layer of the semiconductor element.

7. The memory according to claim 1, wherein the semiconductor element is a two-terminal element.

8. The memory according to claim 1, wherein the third semiconductor layer of the semiconductor element has a terminal to extract carriers.

9. A resistive change memory comprising:
a first ferromagnetic layer and a second ferromagnetic layer;
a semiconductor element disposed between the first ferromagnetic layer and the second ferromagnetic layer, the semiconductor element including a first semiconductor layer of a first conductivity type, a second semiconductor layer of the first conductivity type, and a third semiconductor layer of a second conductivity type that is different from the first conductivity type, the third semiconductor layer being disposed between the first semiconductor layer and the second semiconductor layer, the first semiconductor layer being directly connected to the first ferromagnetic layer, and the second semiconductor layer being directly connected to the second ferromagnetic layer; and
a read unit configured to perform a read operation by applying a first read voltage between the first ferromagnetic layer and the second ferromagnetic layer, and then applying a second read voltage that is lower than the first read voltage between the first ferromagnetic layer and the second ferromagnetic layer,
a magnetization direction of one of the first ferromagnetic layer and the second ferromagnetic layer being switchable, and a magnetization direction of the other being fixed.

10. The memory according to claim 9, wherein a recombination center of an electron and a hole is disposed at an interface between the first semiconductor layer and the third semiconductor layer of the semiconductor element.

11. The memory according to claim 9, wherein the semiconductor element is a two-terminal element.

12. The memory according to claim 9, wherein the third semiconductor layer of the semiconductor element has a terminal to extract carriers.

* * * * *